(12) United States Patent
Saitoh et al.

(10) Patent No.: US 11,322,727 B2
(45) Date of Patent: May 3, 2022

(54) OPTICAL DEVICE

(71) Applicant: FUJIFILM Corporation, Tokyo (JP)

(72) Inventors: Yukito Saitoh, Minami-ashigara (JP); Hiroshi Sato, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 140 days.

(21) Appl. No.: 16/998,875

(22) Filed: Aug. 20, 2020

(65) Prior Publication Data
US 2020/0381668 A1 Dec. 3, 2020

Related U.S. Application Data

(63) Continuation of application No. PCT/JP2019/008689, filed on Mar. 5, 2019.

(30) Foreign Application Priority Data

Mar. 6, 2018 (JP) .............................. JP2018-039465

(51) Int. Cl.
*H01L 51/52* (2006.01)
*H01L 27/32* (2006.01)
*G02B 5/30* (2006.01)

(52) U.S. Cl.
CPC ........ *H01L 51/5281* (2013.01); *G02B 5/3016* (2013.01); *H01L 27/3244* (2013.01); *H01L 27/3211* (2013.01); *H01L 51/5293* (2013.01)

(58) Field of Classification Search
CPC ............. H01L 51/5281; H01L 51/5293; H01L 27/3244; H01L 27/3211; G02B 5/3016; G02B 5/30; G02B 1/111
See application file for complete search history.

(56) References Cited

U.S. PATENT DOCUMENTS 8,338,823 B2* 12/2012 Kim ...................... H01L 33/58
257/E33.072
2003/0127656 A1* 7/2003 Aizawa ............... H01L 51/5281
257/79

(Continued)

FOREIGN PATENT DOCUMENTS

JP      2006-317656 A    11/2006
JP      2007-532959 A    11/2007

(Continued)

OTHER PUBLICATIONS

International Preliminary Report on Patentability and Written Opinion of the International Searching Authority (Forms PCT/IB/326, PCT/IB/373 and PCT/ISA/237) for International Application No. PCT/JP2019/008689, dated Sep. 17, 2020, with an English translation.

(Continued)

*Primary Examiner* — Michael M Trinh
(74) *Attorney, Agent, or Firm* — Birch, Stewart, Kolasch & Birch, LLP

(57) ABSTRACT

An object of the present invention is to provide an optical device that can accomplish both the effect of preventing external light reflection and the improvement of utilization efficiency of light emitted from an organic electroluminescent element. The object is achieved by an optical device having an organic electroluminescent substrate, a circularly polarized light-separating layer that has a liquid crystal alignment pattern, in which the direction of an optical axis derived from a liquid crystal compound changes while continuously rotating in one direction in a plane, and separates light into right-handed circularly polarized light and left-handed circularly polarized light, a patterned retardation layer that converts circularly polarized light into linearly polarized light and has a plurality of regions among which the direction of a slow axis varies in the same plane, and a polarizer.

8 Claims, 6 Drawing Sheets

(56) References Cited

U.S. PATENT DOCUMENTS

| | | | |
|---|---|---|---|
| 2006/0257586 A1 | 11/2006 | Umeya | |
| 2008/0280107 A1 | 11/2008 | Katschorek et al. | |
| 2012/0242918 A1 | 9/2012 | Valyukh et al. | |
| 2014/0203248 A1 | 7/2014 | Zhou et al. | |
| 2016/0118448 A1* | 4/2016 | Epstein | H01L 51/5271 |
| | | | 257/40 |
| 2017/0336546 A1* | 11/2017 | Ohyama | H01L 51/5281 |
| 2018/0164480 A1 | 6/2018 | Yoshida | |
| 2019/0072701 A1 | 3/2019 | Murashige et al. | |
| 2019/0369292 A1* | 12/2019 | Seo | G02B 5/3016 |
| 2020/0142213 A1* | 5/2020 | Sato | G02F 1/13363 |
| 2020/0326579 A1* | 10/2020 | Sato | G02B 27/02 |

FOREIGN PATENT DOCUMENTS

| | | |
|---|---|---|
| JP | 2009-259721 A | 11/2009 |
| JP | 2015-516092 A | 6/2015 |
| JP | 2017-22016 A | 1/2017 |
| WO | WO 2016/194961 A1 | 12/2016 |
| WO | WO 2019/004442 A1 | 1/2019 |

OTHER PUBLICATIONS

International Search Report (Form PCT/ISA/210) for International Application No. PCT/JP2019/008689, dated Jun. 4, 2019.

\* cited by examiner

OPTICAL DEVICE

CROSS-REFERENCE TO RELATED APPLICATIONS

This application is a Continuation of PCT International Application No. PCT/JP2019/008689 filed on Mar. 5, 2019, which claims priority under 35 U.S.C. § 119(a) to Japanese Patent Application No. 2018-039465 filed on Mar. 6, 2018. The above application is hereby expressly incorporated by reference, in its entirety, into the present application.

BACKGROUND OF THE INVENTION

1. Field of the Invention

The present invention relates to an optical device using organic electroluminescence.

2. Description of the Related Art

In recent years, as a display device replacing a liquid crystal display device, organic electroluminescence (organic electro luminescence (EL) (organic light emitting diode (OLED)) has been developed continuously, and a 60-inch large display device (display) has started appearing.

The surface of the organic EL substrate constituting the organic EL display device has a high reflectance. Accordingly, particularly in a bright environment, the surface reflects external light and deteriorates contrast.

Therefore, the surface of the organic EL display device is provided with an antireflection film consisting of a polarizer and a $\lambda/4$ plate.

For example, JP2009-259721A describes an organic EL display device comprising an organic EL element portion which consists of a reflecting electrode, an organic EL light emitting layer, and a transparent electrode and a circular polarization plate which consists of a retardation plate and a polarizing plate, in which an antireflection layer having a high reflectance in a wavelength range of complementary color of the color of light reflected from the surface of the circular polarization plate is provided in an air interface of a member closer to an observer than to the circular polarization plate.

Furthermore, JP2017-022016A describes a circular polarization plate for an organic EL display device and an organic EL display device comprising the circular polarization plate, in which the circular polarization plate comprises a polarizer, a retardation layer functioning as a $\lambda/4$ plate, a barrier layer, and a pressure sensitive adhesive layer functioning as a barrier in this order, and the barrier layer is thin glass having a thickness of 5 to 100 µm.

SUMMARY OF THE INVENTION

Such an organic EL display device is provided with an antireflection film (circular polarization plate) consisting of a polarizer and a $\lambda/4$ plate so as to prevent the reflection of external light and to enable the device to display images with high contrast.

However, the antireflection film consisting of a polarizer and a $\lambda/4$ plate also absorbs the light emitted from an organic EL element. Therefore, the conventional organic EL display device has low light use efficiency, and cannot fully demonstrate the performance of the organic EL element.

An object of the present invention is to solve the above problem of the conventional technique and to provide an optical device using organic EL that can accomplish both the effect of preventing external light reflection and the improvement of utilization efficiency of light emitted from an organic EL element.

In order to achieve the object, the optical device according to an embodiment of the present invention has the following constitution.

[1] An optical device including, in the following order, an organic electroluminescent substrate having light emitting portions by organic electroluminescence and a non-light emitting portion which has a metallic reflecting portion, a circularly polarized light-separating layer that is formed of a composition including a liquid crystal compound, has a liquid crystal alignment pattern in which a direction of an optical axis derived from the liquid crystal compound changes while continuously rotating in at least one direction in a plane, and separates light emitted from the light emitting portions of the organic electroluminescent substrate into right-handed circularly polarized light and left-handed circularly polarized light, a patterned retardation layer that converts the circularly polarized light separated by the circularly polarized light-separating layer into linearly polarized light, has constant in-plane retardation, and includes a plurality of regions among which a direction of a slow axis varies in the same plane, and a polarizer.

[2] The optical device described in [1], in which the organic electroluminescent substrate has the light emitting portions emitting light having different wavelengths.

[3] The optical device described in [2], in which in a case where a length, over which the direction of the optical axis derived from the liquid crystal compound rotates 180° in one direction along which the direction of the optical axis derived from the liquid crystal compound changes while continuously rotating in the liquid crystal alignment pattern of the circularly polarized light-separating layer, is regarded as one period, the optical device has a plurality of kinds of circularly polarized light-separating layers among which the length of the one period varies.

[4] The optical device described in [3], in which in the circularly polarized light-separating layer, depending on a wavelength of an incidence ray, the longer the wavelength of the incidence ray that is incident on a region, the longer the one period in the region.

[5] The optical device described in any one of [1] to [4], in which the circularly polarized light-separating layer has an isotropic region in which no liquid crystals are aligned.

[6] The optical device described in [5], in which the isotropic region is provided in a region on which the light from the light emitting portions of the organic electroluminescent substrate is not incident.

[7] The optical device described in any one of [1] to [6], in which the patterned retardation layer has a region having a slow axis forming an angle of +45° with a transmission axis of the polarizer and a region having a slow axis forming an angle of −45° with the transmission axis of the polarizer.

[8] The optical device described in any one of [1] to [7], further having a support, in which one surface of the support is provided with the circularly polarized light-separating layer and the other surface of the support is provided with the patterned retardation layer and the polarizer.

According to the optical device of an embodiment of the present invention, in an optical device using organic EL, it is possible to accomplish both the effect of preventing external light reflection and the improvement of utilization efficiency of light emitted from an organic EL element.

DESCRIPTION OF THE PREFERRED EMBODIMENTS

Hereinafter, the optical device according to an embodiment of the present invention will be specifically described based on suitable examples illustrated in the attached drawings.

In the present specification, a range of numerical values described using "to" means a range including the numerical values described before and after "to" as a lower limit and an upper limit.

In the present specification, "(meth) acrylate" is used as a term meaning "either or both of acrylate and methacrylate".

In the present specification, visible light refers to light of a wavelength visible to the human eye among electromagnetic waves, which is light in a wavelength range of 380 to 780 nm. Invisible light refers to light in a wavelength range shorter than 380 nm and a wavelength range longer than 780 nm.

Furthermore, although there is no particular limitation, among visible lights, light in a wavelength range of 420 to 490 nm is blue light, light in a wavelength range of 495 to 570 nm is green light, and light in a wavelength range of 620 to 750 nm is red light.

In the present specification, Re ($\lambda$) represents in-plane retardation at a wavelength $\lambda$. Unless otherwise specified, the wavelength $\lambda$, is 550 nm.

In the present specification, Re ($\lambda$) is a value measured at a wavelength $\lambda$, by using AxoScan (manufactured by Axometrics, Inc). By inputting an average refractive index ($(n_x+n_y+n_z)/3$) and a film thickness (d ($\mu m$)) in Axo Scan,
   a slow axis direction)(°) and
   $Re(\lambda)=R0(\lambda)$
are calculated.

R0 ($\lambda$) is represented by a numerical value calculated by AxoScan, and means Re ($\lambda$).

The optical device according to an embodiment of the present invention is an optical device which is used in an organic EL display device, an organic EL lighting device, and the like and exploits light emission by organic EL. The optical device has an organic EL substrate having a non-light emitting portion having a metallic reflecting portion and light emitting portions by organic EL, a circularly polarized light-separating layer having a liquid crystal alignment pattern in which the direction of an optical axis derived from a liquid crystal compound changes while continuously rotating along at least one direction in the plane, a patterned retardation layer having a predetermined value (for example, $\lambda/4$) of in-plane retardation that is constant and a plurality of regions among which the direction of a slow axis varies in the same plane, and a polarizer.

According to such an optical device of the embodiment of the present invention, in an organic EL display device or the like, both the prevention of external light reflection and the improvement of utilization efficiency of light emitted by organic EL can accomplished.

Figure 1:
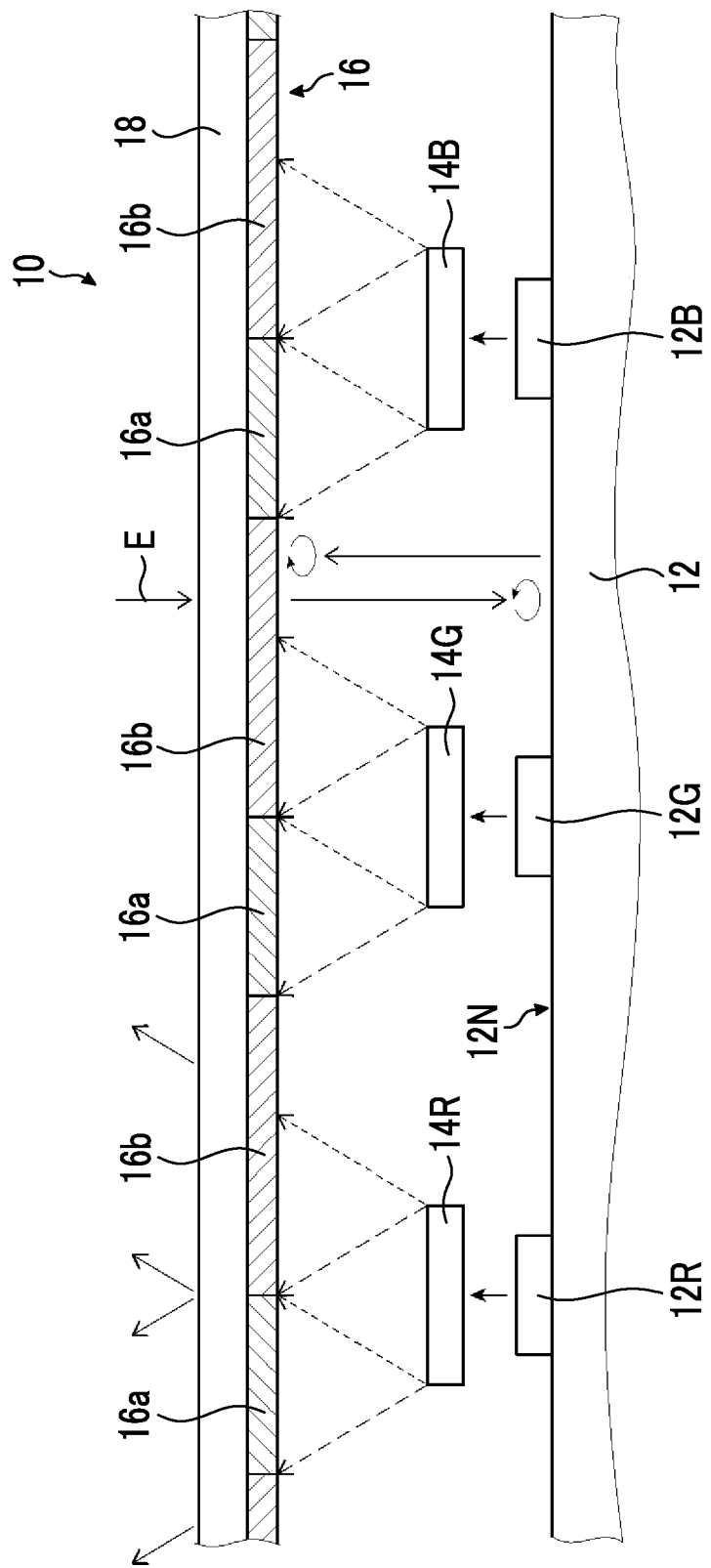
FIG. 1 is a conceptual view of an example of an optical device according to an embodiment of the present invention.

FIG. 1 is a conceptual view of an example of the optical device according to an embodiment of the present invention.

The optical device shown in FIG. 1 is an optical device used as an organic electro luminescence (EL) display device (organic EL display), an organic EL lighting device, and the like. The optical device has an organic EL substrate 12, an R circularly polarized light-separating member 14R, G circularly polarized light-separating member 14G, a B circularly polarized light-separating member 14B, a patterned retardation layer 16, and a polarizer 18.

<Organic EL Substrate>

The organic EL substrate 12 is a known organic EL substrate (an organic EL panel or an organic EL light emitting element substrate) used in an organic EL display device or the like.

The optical device 10 illustrated in the drawing is for displaying full color images. The organic EL substrate 12 has an R light emitting portion 12R that emits red light by organic EL, a G light emitting portion 12G that emits green light by organic EL, and a B light emitting portion 12B that emits blue light by organic EL. In the following description, in a case where the R light emitting portion 12R, the G light emitting portion 12G, and the B light emitting portion 12B do not need to be distinguished from one another, the R light emitting portion 12R, the G light emitting portion 12G, and the B light emitting portion 12B will be collectively called "light emitting portion" as well.

Figure 11:
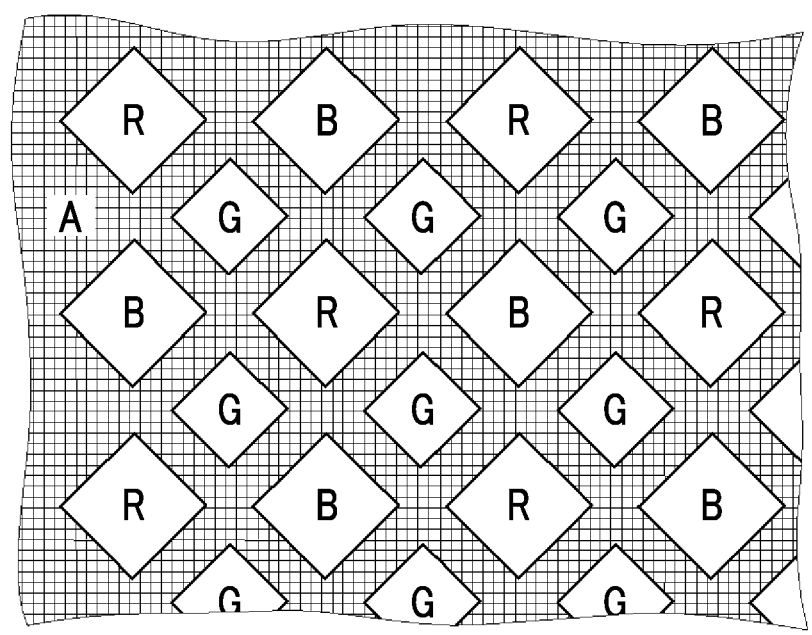
FIG. 11 is a conceptual view for illustrating an example of the present invention.

In the organic EL substrate 12, a number of R light emitting portions 12R, G light emitting portions 12G, and B light emitting portions 12B described above are two-dimensionally arranged as in known organic EL substrates (see the mask shown in FIG. 11).

As described above, the organic EL substrate 12 is a known organic EL substrate. Therefore, the R light emitting portion 12R, the G light emitting portion 12G, and the B light emitting portion 12B are all known organic EL elements (an organic EL light emitting element, an organic EL light emitting portion, and an organic electroluminescent layer).

In the organic EL substrate 12, within the surface on which the R light emitting portion 12R, the G light emitting portion 12G, and the B light emitting portion 12B are formed, a region without the R light emitting portion 12R, the G light emitting portion 12G, and the B light emitting portion 12B is a non-light emitting portion 12N.

In the non-light emitting portion 12N, metal wiring, metal electrodes, and the like are formed as in known organic EL substrates. The metal wiring and the like are the metallic reflecting portion in the non-light emitting portion 12N.

In the optical device 10 illustrated in the drawing, the organic EL substrate 12 is a substrate for displaying full color images and the like that has the R light emitting portion 12R, the G light emitting portion 12G, and the B light emitting portion 12B. However, the present invention is not limited thereto.

For example, the organic EL substrate may be a substrate for displaying monochromic images that has only one of the R light emitting portion 12R, the G light emitting portion 12G, and the B light emitting portion 12B. Alternatively, the organic EL substrate may be a substrate for displaying dichromatic images and the like that has the R light emitting portion 12R and the G light emitting portion 12G, the R light emitting portion 12R and the B light emitting portion 12B, or the G light emitting portion 12G and the B light emitting portion 12B.

In a case where the display device of the present invention is for displaying monochromic image, dichromatic images, and the like, the display device is provided only with a circularly polarized light-separating member (circularly polarized light-separating region), which will be described later, for each color.

Examples of methods of causing light to be efficiently emitted to the front from each of the light emitting portions of the organic EL substrate include a method of shaping the organic EL substrate for collecting light, a method of using a microcavity, and the like.

Examples of the method of shaping the organic EL substrate for collecting light include the method described in JP1988-314795A (JP-S63-314795A). Examples of the method of using a microcavity include the method described in JP2010-153284A.

<Circularly Polarized Light-Separating Member>

In the optical device 10, the R circularly polarized light-separating member 14R is disposed in a region which is above the R light emitting portion 12R and irradiated with red light from the R light emitting portion 12R. The R circularly polarized light-separating member 14R is disposed in a region which is above the G light emitting portion 12G and irradiated with green light from the G light emitting portion 12G. Furthermore, the B circularly polarized light-separating member 14B is disposed in a region which is above the B light emitting portion 12B and irradiated with blue light from the B light emitting portion 12B.

The R circularly polarized light-separating member 14R divides the non-polarized red light emitted from the R light emitting portion 12R into right-handed circularly polarized light and left-handed circularly polarized light, and emits the left-handed circularly polarized light (fine broken line) to the right side in the drawing and the right-handed circularly polarized light (thick broken line) to the left side in the drawing.

The G circularly polarized light-separating member 14G divides the non-polarized green light emitted from the G light emitting portion 12G into right-handed circularly polarized light and left-handed circularly polarized light, and emits the left-handed circularly polarized light (fine broken line) to the right side in the drawing and the right-handed circularly polarized light (thick broken line) to the left side in the drawing.

The B circularly polarized light-separating member 14B divides the non-polarized blue light emitted from the B light emitting portion 12B into right-handed circularly polarized light and left-handed circularly polarized light, and emits the left-handed circularly polarized light (fine broken line) to the right side in the drawing and the right-handed circularly polarized light (thick broken line) to the left side in the drawing.

Figure 2:
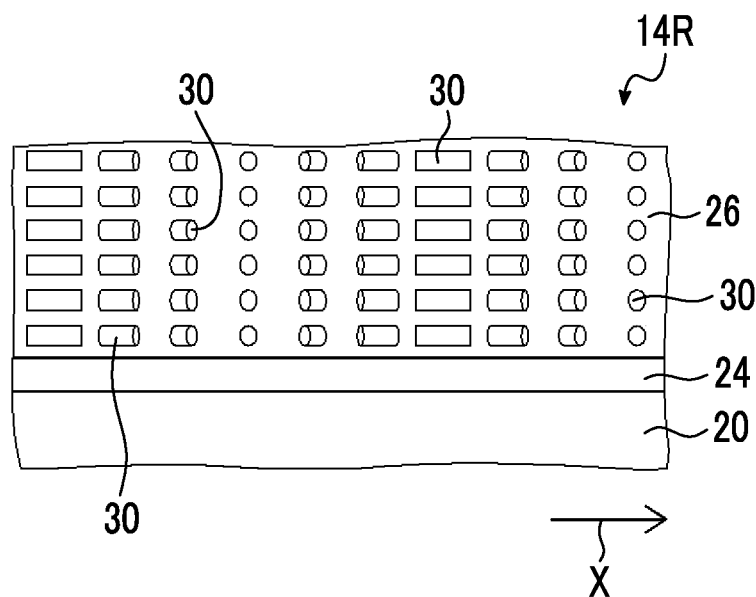
FIG. 2 is a conceptual view of a circularly polarized light-separating layer of the optical device shown in FIG. 1.

FIG. 2 conceptually shows the R circularly polarized light-separating member 14R.

In the following section, the R circularly polarized light-separating member 14R will be described as a typical example. However, the G circularly polarized light-separating member 14G and the B circularly polarized light-separating member 14B basically have the same constitution.

The R circularly polarized light-separating member 14R has a support 20, an alignment film 24, and a circularly polarized light-separating layer 26. Therefore, the G circularly polarized light-separating member 14G and the B circularly polarized light-separating member 14B also have the same support 20, alignment film 24, and circularly polarized light-separating layer 26.

Furthermore, in the following description, in a case where the R circularly polarized light-separating member 14R, the G circularly polarized light-separating member 14G, and the B circularly polarized light-separating member 14B do not need to be distinguished from one another, the R circularly polarized light-separating member 14R, the G circularly polarized light-separating member 14G, and the B circularly polarized light-separating member 14B will be collectively called "circularly polarized light-separating member" as well.

The R circularly polarized light-separating member 14R, the G circularly polarized light-separating member 14G, and the B circularly polarized light-separating member 14B are arranged such that the side of the circularly polarized light-separating layer 26 faces the side of the organic EL substrate 12.

<<Support>>

In the R circularly polarized light-separating member 14R, the support 20 supports the alignment film 24 and the circularly polarized light-separating layer 26.

The same is true of the G circularly polarized light-separating member 14G and the B circularly polarized light-separating member 14B.

Various sheet-like substances (films and plate-like substances) can be used as the support 20 as long as the substances can support the alignment film 24 and the circularly polarized light-separating layer 26.

As the support 20, a transparent support is preferable, and examples thereof include a polyacrylic resin film such as polymethylmethacrylate, a cellulose-based resin film such as cellulose triacetate, a cycloolefin polymer-based film, polyethylene terephthalate (PET), polycarbonate, polyvinyl chloride, and the like. As the cycloolefin polymer-based film, for example, it is possible to use commercially available products such as "ARTON (trade name)" manufactured by JSR Corporation and "ZEONOR (trade name)" manufactured by ZEON CORPORATION.

The support is not limited to a flexible film, and may be a non-flexible substrate such as a glass substrate.

The thickness of the support 20 is not limited, and may be appropriately set according to the use of the optical device 10, the material forming the support 20, and the like such that the support 20 can support the alignment film 24 and the circularly polarized light-separating layer 26.

The thickness of the support 20 is preferably 1 to 1,000 µm, more preferably 3 to 250 µm, and even more preferably 5 to 150 µm.

<<Alignment Film>>

In the R circularly polarized light-separating member 14R, the alignment film 24 is formed on the surface of the support 20.

The alignment film 24 is used for aligning liquid crystal compounds 30 in a predetermined liquid crystal alignment pattern in forming the circularly polarized light-separating layer 26 of the R circularly polarized light-separating member 14R.

The point described above is the same for the G circularly polarized light-separating member 14G and the B circularly polarized light-separating member 14B.

As will be described later, in the optical device 10 according to the embodiment of the present invention, the circularly polarized light-separating layer 26 has a liquid crystal alignment pattern in which the direction of an optical axis 30A (see FIG. 3) derived from the liquid crystal compound 30 changes while continuously rotating along one direction (an arrow X direction which will be described later) in the plane.

Accordingly, the alignment film 24 of each of the circularly polarized light-separating members is formed such that the circularly polarized light-separating layer 26 can form the liquid crystal alignment pattern.

In the present invention, a length, over which the direction of the optical axis 30A rotates 180° in one direction in which the direction of the optical axis 30A changes while continuously rotating in the liquid crystal alignment pattern of the circularly polarized light-separating layer 26, is regarded as one period (rotation period of the optical axis).

In a preferred aspect of the optical device 10 of the present invention, the length of one period (one period A) varies among the circularly polarized light-separating layers 26 of the R circularly polarized light-separating member 14R, the G circularly polarized light-separating member 14G, and the B circularly polarized light-separating member 14B according to the wavelength of the corresponding light (color of light).

Specifically, regarding the length of one period in the liquid crystal alignment pattern of the circularly polarized light-separating layer 26, it is preferable that the longer the wavelength of the corresponding light handled by the layer 26, the longer the one period in the layer 26. That is, in the circularly polarized light-separating layer 26, the order of sizes of wavelengths of the corresponding light preferably coincides with the order of lengths of one period.

Therefore, for the circularly polarized light-separating members, one period in the liquid crystal alignment pattern of the circularly polarized light-separating layer 26 is preferably the shortest in the B circularly polarized light-separating member 14B, the second shortest in the G circularly polarized light-separating member 14G, and the longest in the R circularly polarized light-separating member 14R.

The alignment film 24 has such an alignment pattern that the circularly polarized light-separating layers of the circularly polarized light-separating members obtain a liquid crystal alignment pattern in which the order of sizes of wavelengths of the corresponding light coincides with the order of lengths of one period.

In the following description, "the direction of the optical axis 30A rotates" will be also simply described as "the optical axis 30A rotates".

As the alignment film 24, various known alignment films can be used.

Examples thereof include a rubbing treatment film made of an organic compound such as a polymer, an obliquely deposited film of an inorganic compound, a film having microgrooves, and a film obtained by layering Langmuir-Blodgett (LB) films prepared by the Langmuir-Blodgett method by using organic compounds such as co-tricosanoic acid, dioctadecylmethylammonium chloride, and methyl stearate.

The alignment film 24 prepared by the rubbing treatment can be formed by rubbing several times the surface of a polymer layer with paper or cloth in a certain direction.

As materials used for the alignment film 24, for example, polyimide, polyvinyl alcohol, polymers having a polymerizable group described in JP1997-152509A (JP-H09-152509A), and the materials used for forming the alignment film 24 or the like described in JP2005-097377A, JP2005-099228A, and JP2005-128503A are preferred.

In the optical device 10 according to the embodiment of the present invention, as the alignment film 24, so-called photo alignment film is suitably used which is obtained by irradiating a photo-alignable material with polarized light or unpolarized light so as to obtain the alignment film 24. That is, in the optical device 10 according to the embodiment of the present invention, as the alignment film 24, an alignment film 24 is suitably used which is formed by coating the support 20 with a photo alignment material.

The irradiation of the alignment film 24 with polarized light can be performed in a vertical direction or an oblique direction. The irradiation of the alignment film 24 with unpolarized light can be performed in an oblique direction.

As the photo alignment material used for the alignment film 24 that can be used in the present invention, for example, the azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, and JP4151746B, the aromatic ester compounds described in JP2002-229039A, the maleimide and/or alkenyl-substituted nadiimide compounds having a photo-alignable unit described in JP2002-265541A and JP2002-317013A, the photo-crosslinkable silane derivatives described in JP4205195B and JP4205198B, the photo-crosslinkable polyimide, the photo-crosslinkable polyamide, and the photo-crosslinkable ester described in JP2003-520878A, JP2004-529220A, and JP4162850B, the photo-dimerizable compounds, particularly, the cinnamate compound, chalcone compound, and coumarin compound described in JP1997-118717A (JP-H09-118717A), JP1998-506420A (JP-H10-506420A), JP2003-505561A, WO2010/150748A, JP2013-177561A, and JP2014-012823A, and the like are preferable.

Among these, the azo compounds, photo-crosslinkable polyimide, the photo-crosslinkable polyamide, the photo-crosslinkable ester, the cinnamate compound, and the chalcone compound are suitably used.

The thickness of the alignment film 24 is not particularly limited, and may be appropriately set according to the material forming the alignment film 24 such that a necessary alignment function is obtained. The thickness of the alignment film 24 is preferably 0.01 to 5 µm, and more preferably 0.05 to 2 µm.

As methods of forming the alignment film 24, it is possible to use various known methods according to the material forming the alignment film 24 without particular limitation. Examples thereof include a method of coating the surface of the support 20 with the alignment film 24, drying the alignment film 24, and then exposing the alignment film 24 to a laser beam so as to form an alignment pattern.

Figure 6:
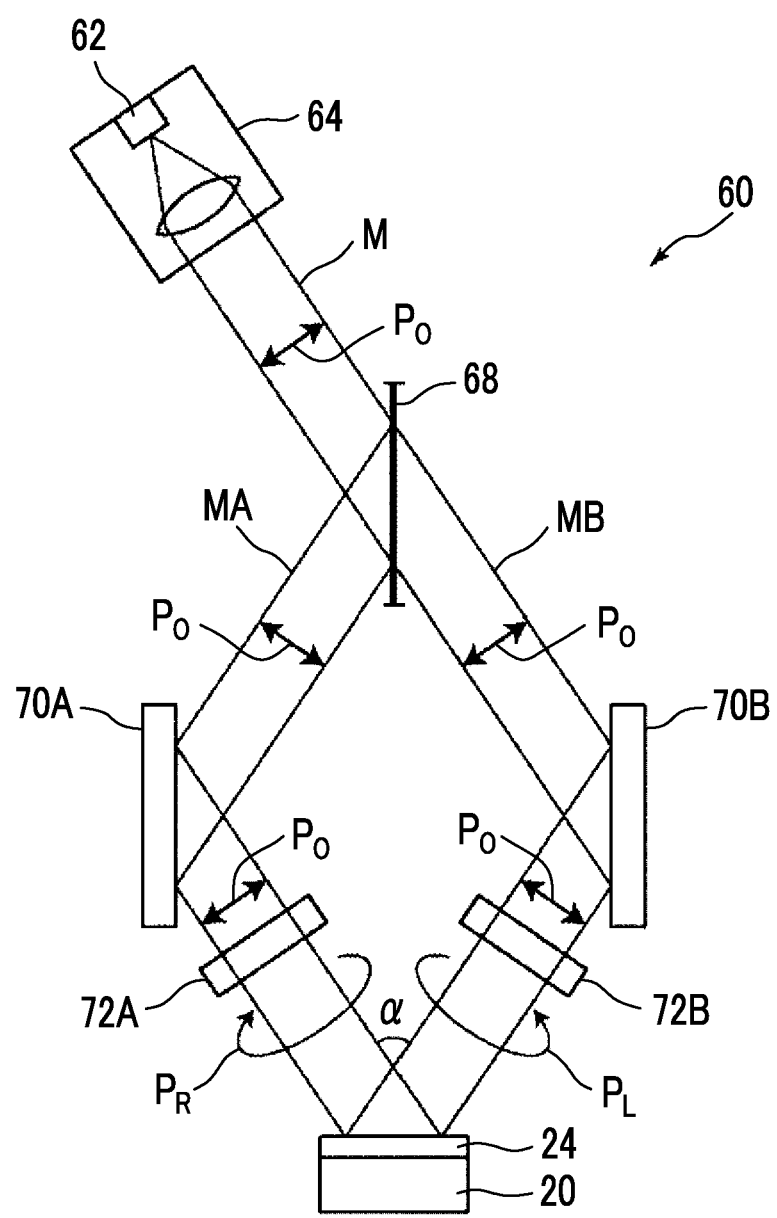
FIG. 6 is a conceptual view of an example of an exposure device that exposes an alignment film.

FIG. 6 conceptually shows an example of an exposure device that forms an alignment pattern by exposing the alignment film 24.

An exposure device 60 shown in FIG. 6 comprises a light source 64 comprising a laser 62, a beam splitter 68 that splits a laser beam M emitted from the laser 62 into two light rays MA and MB, mirrors 70A and 70B arranged on the optical paths of the two split light rays MA and MB respectively, and λ/4 plates 72A and 72B.

The light source 64 comprises a polarizer and emits linearly polarized light $P_O$ although the polarizer is not shown in the drawing. The λ/4 plates 72A and 72B comprise optical axes (slow axes) that are orthogonal to each other. The λ/4 plate 72A converts the linearly polarized light $P_O$ (light ray MA) into right-handed circularly polarized light $P_R$, and the λ/4 plate 72B converts the linearly polarized light $P_O$ (light ray MB) into left-handed circularly polarized light $P_L$.

The support 20 having the alignment film 24 on which an alignment pattern has not yet been formed is disposed on an exposure portion. The two light rays MA and MB are crossed on the alignment film 24 such that interference occurs, and the alignment film 24 is exposed by being irradiated with the interference light.

Due to the interference, the polarization state of the light radiated to the alignment film 24 periodically changes in the form of interference fringes. As a result, the alignment film 24 obtains an alignment pattern in which the alignment state periodically changes.

In the exposure device 60, by changing an intersecting angle α between the two light rays MA and MB, the period of the alignment pattern can be adjusted. That is, in the exposure device 60, in a case where the intersecting angle α is adjusted, in the alignment pattern in which the optical axis 30A derived from the liquid crystal compound 30 continuously rotates in one direction, the length of one period (one period Λ) in which the optical axis 30A rotates 180° in one direction along which the optical axis 30A rotates can be adjusted.

By forming the circularly polarized light-separating layer 26 on the alignment film 24 having the alignment pattern in which the alignment state periodically changes, as will be described later, it is possible to form a circularly polarized light-separating layer 26 having a liquid crystal alignment pattern in which the optical axis 30A derived from the liquid crystal compound 30 continuously rotates in one direction.

Furthermore, by rotating 90° the optical axis of each of the λ/4 plates 72A and 72B, the rotation direction of the optical axis 30A can be reversed.

In the optical device according to the embodiment of the present invention, the alignment film 24 is provided as a preferred aspect and is not an essential constituent.

For example, an alignment pattern can be formed on the support 20 by a method of performing a rubbing treatment on the support 20, a method of processing the support 20 by using laser beams, or the like such that the circularly polarized light-separating layer 26 or the like has a constitution including a liquid crystal alignment pattern in which the direction of the optical axis 30A derived from the liquid crystal compound 30 changes while continuously rotating in at least one direction in the plane.

<<Circularly Polarized Light-Separating Layer>>

In the R circularly polarized light-separating member 14R, the circularly polarized light-separating layer 26 is formed on the surface of the alignment film 24.

In FIG. 1 (and FIGS. 4 and 5 which will be described later), in order to simplify the drawing and clearly show the constitution of the optical device 10, the circularly polarized light-separating layer 26 is illustrated as having the liquid crystal compound 30 (liquid crystal compound molecules) only on the surface of the alignment film 24. However, as being conceptually shown in FIG. 2, the circularly polarized light-separating layer 26 has a structure in which the aligned liquid crystal compounds 30 are stacked as in a circularly polarized light-separating layer 26 formed using a composition including a general liquid crystal compound.

The point described above is the same for the G circularly polarized light-separating member 14G and the B circularly polarized light-separating member 14B.

As described above, in the optical device 10 according to the embodiment of the present invention, the circularly polarized light-separating layer 26 is formed using a composition including a liquid crystal compound.

In a case where the value of in-plane retardation is set to λ/2, the circularly polarized light-separating layer 26 has the function of a general λ/2 plate, that is, the function of having wavelength, in other words, the function of causing phase difference of 180° in two intersecting linear polarization components included in the light incident on the circularly polarized light-separating layer 26.

The circularly polarized light-separating layer 26 has a liquid crystal alignment pattern in which the direction of an optical axis derived from the liquid crystal compound 30 changes while continuously rotating in one direction indicated by an arrow X in the plane of the circularly polarized light-separating layer 26.

The optical axis 30A derived from the liquid crystal compound 30 is an axis on which a refractive index is the highest in the liquid crystal compound 30. For example, in a case where the liquid crystal compound 30 is a rod-shaped liquid crystal compound, the optical axis 30A extends in the longitudinal direction of the rod shape.

Hereinafter, "one direction indicated by the arrow X" will be also simply described as "arrow X direction". Furthermore, hereinafter, the optical axis 30A derived from the liquid crystal compound 30 will be also described as "optical axis 30A of the liquid crystal compound 30" or "optical axis 30A".

In the circularly polarized light-separating layer 26, the liquid crystal compounds 30 are two-dimensionally arranged in a plane of the circularly polarized light-separating layer 26 parallel to the arrow X direction and a Y direction orthogonal to the arrow X direction. In FIGS. 1 and 2 and FIGS. 4 and 5 which will be described later, the Y direction is a direction orthogonal to the surface of paper.

Figure 3:
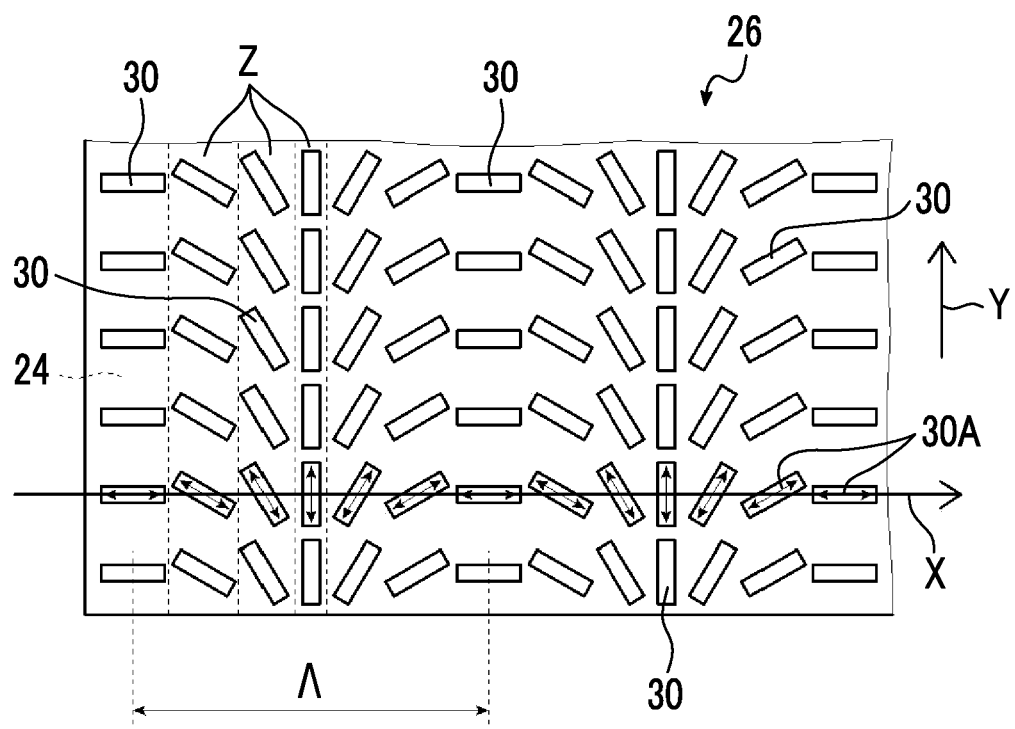
FIG. 3 is a plan view conceptually showing the circularly polarized light-separating layer of the optical device shown in FIG. 1.

FIG. 3 is a plan view conceptually showing the circularly polarized light-separating layer 26.

The plan view is a view of the optical device 10 in FIG. 1 that is seen from above. That is, in the plan view, the optical device 10 is seen in a thickness direction. In other words, in the plan view, the circularly polarized light-separating layer 26 is seen in a direction orthogonal to the main surface of the layer 26. "Main surface" is the largest surface of a sheet-like substance. Furthermore, "thickness direction" is a direction along which layers (films) are laminated.

Furthermore, in FIG. 3, in order to clearly show the constitution of the optical device 10 according to the embodiment of the present invention, as in FIG. 1 or the like, the liquid crystal compound 30 is illustrated as being located only within the surface of the alignment film 24. However, as described above, the circularly polarized light-separating layer 26 has a structure in which the liquid crystal compounds 30 are stacked on the liquid crystal compounds 30 within the surface of the alignment film 24 as shown in FIG. 2.

The circularly polarized light-separating layer 26 has a liquid crystal alignment pattern in which the direction of the optical axis 30A derived from the liquid crystal compound 30 changes while continuously rotating in the arrow X direction in the plane of the circularly polarized light-separating layer 26.

Specifically, "direction of the optical axis 30A of the liquid crystal compound 30 changes while continuously rotating in the arrow X direction (a predetermined direction)" means that the angle formed between the optical axis 30A of the liquid crystal compounds 30 arranged along the arrow X direction and the arrow X direction changes with the position of the arrow X direction, and the angle formed between the optical axis 30A and the arrow X direction sequentially changes from θ to θ+180° or θ−180° along the arrow X direction.

The difference between the angles of the optical axes 30A of the liquid crystal compounds 30 adjacent to each other in the arrow X direction is preferably equal to or smaller than 45°, more preferably equal to or smaller than 15°, and even more preferably a smaller angle.

The liquid crystal compounds 30 forming the circularly polarized light-separating layer 26 are provided such that in the Y direction orthogonal to the arrow X direction, that is, in the Y direction orthogonal to one direction along which the optical axes 30A continuously rotate, the liquid crystal compounds 30 having the optical axes 30A in the same direction are arranged at equal intervals.

In other words, the liquid crystal compounds 30 forming the circularly polarized light-separating layer 26 are arranged such that the optical axis 30A of the liquid crystal compounds 30 and the arrow X direction form the same angle in the Y direction.

As described above, in the optical device 10 according to the embodiment of the present invention, a length (distance), over which the optical axis 30A of the liquid crystal compound 30 rotates 180° in the arrow X direction along which the direction of the optical axis 30A changes while continuously rotating in the plane of the liquid crystal alignment pattern of such a liquid crystal compound 30, is regarded as a length Λ of one period in the liquid crystal alignment pattern. In other words, the length of one period in the liquid crystal alignment pattern is defined by the distance over which the angle formed between the optical axis 30A of the liquid crystal compound 30 and the arrow X direction changes to θ+180° from θ.

That is, a center-to-center distance between two liquid crystal compounds 30 in the arrow X direction that form the same angle with the arrow X direction is regarded as the length Λ of one period. Specifically, as shown in FIG. 3, a center-to-center distance between two liquid crystal compounds 30 in the arrow X direction in which the arrow X direction coincides with the direction of the optical axis 30A is regarded as the length Λ of one period. Hereinafter, the length Λ of one period will be also described as "one period Λ".

In the optical device 10 according to the embodiment of the present invention, the one period Λ in the liquid crystal alignment pattern of the circularly polarized light-separating layer 26 repeats in the arrow X direction, that is, in one direction along which the direction of the optical axis 30A continuously rotates and changes.

As described above, in the circularly polarized light-separating layer 26, the angle formed between the optical axis 30A and the arrow X direction (one direction along which the direction of the optical axis of the liquid crystal compound 30 rotates) is the same for the liquid crystal compounds arranged in the Y direction. A region where the liquid crystal compounds 30, for which the angle formed between the optical axis 30A and the arrow X direction is the same, are arranged in the Y direction is called region Z.

In this case, the value of in-plane retardation (Re) in each region Z is preferably half wavelength, that is, λ/2. The in-plane retardation in each region Z is calculated by the product of a refractive index difference Δn resulting from the refractive index anisotropy of the region Z and a thickness of the circularly polarized light-separating layer 26. The refractive index difference resulting from the refractive index anisotropy of the region Z in the circularly polarized light-separating layer 26 means a refractive index difference defined by a difference between a refractive index in a direction of a slow axis in the plane of the region Z and a refractive index in a direction orthogonal to the direction of the slow axis. That is, the refractive index difference Δn resulting from the refractive index anisotropy of the region Z equals a difference between a refractive index of the liquid crystal compound 30 in the direction of the optical axis 30A and a refractive index of the liquid crystal compound 30 in a direction perpendicular to the optical axis 30A in the plane of the region Z. That is, the refractive index difference Δn equals the difference in refractive index between the liquid crystal compounds.

In a case where circularly polarized light is incident on the circularly polarized light-separating layer 26, the light is refracted, and the direction of the circularly polarized light is changed.

Figure 4:
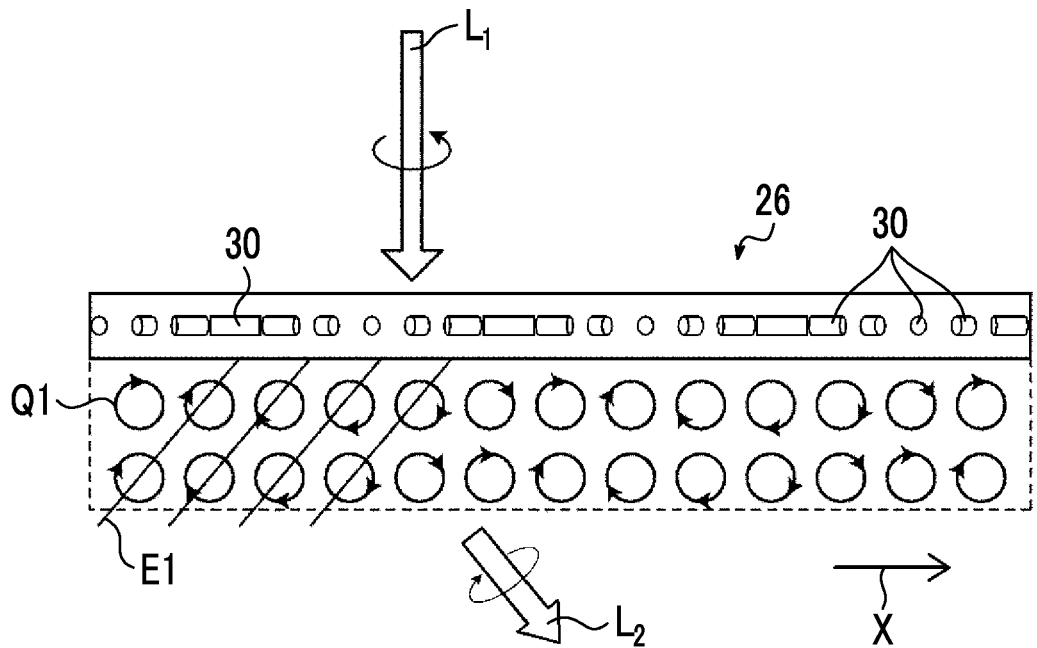
FIG. 4 is a conceptual view showing an action of the circularly polarized light-separating layer of the optical device shown in FIG. 1.

This action is conceptually shown in FIG. 4. In the circularly polarized light-separating layer 26, the product of the refractive index difference between the liquid crystal compounds and the thickness of the circularly polarized light-separating layer 26 is λ/2.

As shown in FIG. 4, in a case where the product of the refractive index difference between the liquid crystal compounds of the circularly polarized light-separating layer 26 and the thickness of the circularly polarized light-separating layer 26 is λ/2, and an incidence ray $L_1$ as left-handed circularly polarized light is incident on the circularly polarized light-separating layer 26, because the incidence ray $L_1$ passes through the circularly polarized light-separating layer 26, a phase difference of 180° is caused in $L_1$. As a result, transmitted light $L_2$ is converted into right-handed circularly polarized light.

Furthermore, while the incidence ray $L_1$ is passing through the circularly polarized light-separating layer 26, the absolute phase thereof changes according to the direction of the optical axis 30A of each of the liquid crystal compounds 30. At this time, the direction of the optical axis 30A changes while rotating along the arrow X direction. Therefore, the amount of change in the absolute phase of the incidence ray $L_1$ varies with the direction of the optical axis 30A. Furthermore, the liquid crystal alignment pattern formed on the circularly polarized light-separating layer 26 is a pattern showing periodicity in the arrow X direction. Therefore, as shown in FIG. 4, the incidence ray $L_1$ having passed through the circularly polarized light-separating layer 26 obtains an absolute phase Q1 showing periodicity in the arrow X direction according to the direction of each of the optical axes 30A. As a result, an equiphase plane E1 inclined in the opposite direction of the arrow X direction is formed.

Therefore, the transmitted light $L_2$ is refracted to be inclined in a direction perpendicular to the equiphase plane E1, and travels in a direction different from the traveling direction of the incidence ray $L_1$. In this way, the incidence ray $L_1$ as left-handed circularly polarized light is converted into the transmitted light $L_2$ as right-handed circularly polarized light inclined by a certain angle to the arrow X direction from the incidence direction.

Figure 5:
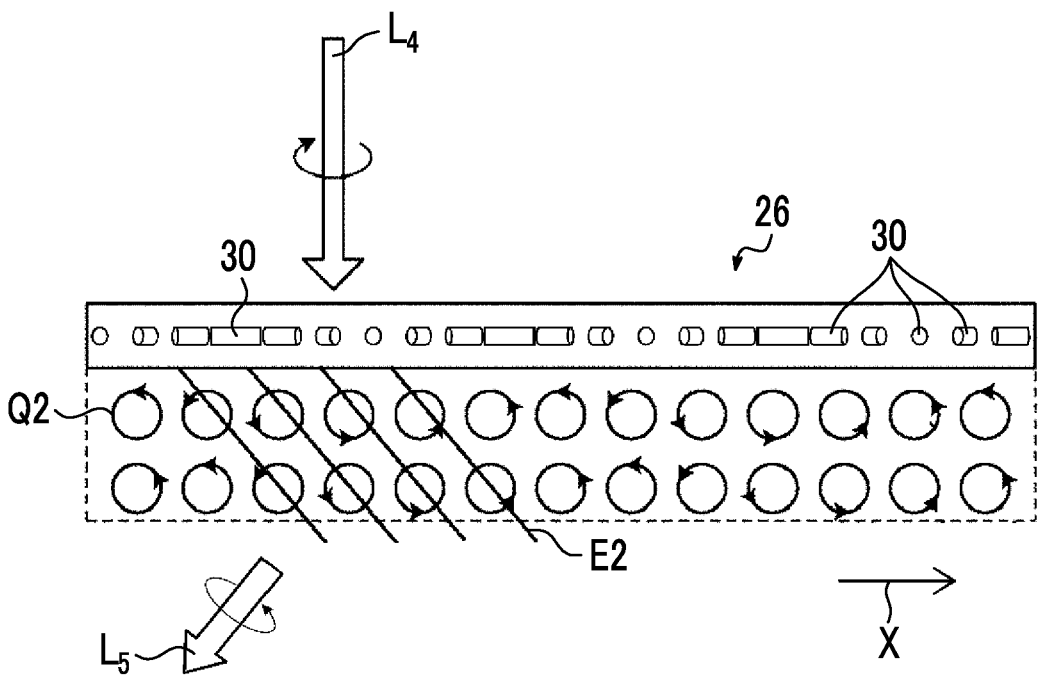
FIG. 5 is a conceptual view showing an action of the circularly polarized light-separating layer of the optical device shown in FIG. 1.

On the other hand, as conceptually shown in FIG. 5, in a case where the product of the refractive index difference between the liquid crystal compounds of the circularly polarized light-separating layer 26 and the thickness of the circularly polarized light-separating layer 26 is $\lambda/2$, and an incidence ray $L_4$ as right-handed circularly polarized light is incident on the circularly polarized light-separating layer 26, because the incidence ray $L_4$ passes through the circularly polarized light-separating layer 26, a phase difference of 180° is caused in $L_4$. As a result, $L_4$ is converted into transmitted light $L_5$ as left-handed circularly polarized light.

Furthermore, while the incidence ray $L_4$ is passing through the circularly polarized light-separating layer 26, the absolute phase thereof changes according to the direction of the optical axis 30A of each of the liquid crystal compounds 30. At this time, the direction of the optical axis 30A changes while rotating along the arrow X direction. Therefore, the amount of change in the absolute phase of the incidence ray $L_4$ varies with the direction of the optical axis 30A. Furthermore, the liquid crystal alignment pattern formed on the circularly polarized light-separating layer 26 is a pattern showing periodicity in the arrow X direction. Therefore, as shown in FIG. 5, the incidence ray $L_4$ having passed through the circularly polarized light-separating layer 26 obtains an absolute phase Q2 showing periodicity in the arrow X direction according to the direction of each of the optical axes 30A.

The incidence ray $L_4$ is right-handed circularly polarized light. Accordingly, an absolute phase Q2 showing periodicity in the arrow X direction according to the direction of the optical axis 30A is opposite to the incidence ray $L_1$ as left-handed circularly polarized light. As a result, in the incidence ray La, an equiphase plane E2 is formed which is inclined to the arrow X direction in the opposite direction of the incidence ray $L_1$.

Therefore, the incidence ray $L_4$ is refracted to be inclined in a direction perpendicular to the equiphase plane E2, and travels in a direction different from the traveling direction of the incidence ray $L_4$. In this way, the incidence ray $L_4$ is converted into the transmitted light $L_5$ as left-handed circularly polarized light inclined by a certain angle in the opposite direction of the arrow X direction from the incidence direction.

Accordingly, by the action of the circularly polarized light-separating layer 26, the R circularly polarized light-separating member 14R splits the non-polarized red light emitted from the R light emitting portion 12R into a component of right-handed circularly polarized light and a component of left-handed circularly polarized light, and emits the left-handed circularly polarized light represented by the fine broken line to the right side in the drawing and the right-handed circularly polarized light represented by the thick broken line to the left side in the drawing.

Furthermore, by the action of the circularly polarized light-separating layer 26, the G circularly polarized light-separating member 14G splits the non-polarized green light emitted from the G light emitting portion 12G into a component of right-handed circularly polarized light and a component of left-handed circularly polarized light, and emits the left-handed circularly polarized light represented by the fine broken line to the right side in the drawing and the right-handed circularly polarized light represented by the thick broken line to the left side in the drawing.

In addition, by the action of the circularly polarized light-separating layer 26, the B circularly polarized light-separating member 14B splits the non-polarized green light emitted from the B light emitting portion 12B into a component of right-handed circularly polarized light and a component of left-handed circularly polarized light, and emits the left-handed circularly polarized light represented by the fine broken line to the right side in the drawing and the right-handed circularly polarized light represented by the thick broken line to the left side in the drawing.

The circularly polarized light-separating layer 26 can reverse the refraction direction of the transmitted light by reversing the rotation direction of the optical axis 30A of the liquid crystal compound 30 that rotates along the arrow X direction.

In the circularly polarized light-separating layer 26, the value of in-plane retardation of the plurality of regions Z is preferably a half wavelength. The in-plane retardation of the plurality of regions Z in the circularly polarized light-separating layer 26 for an incidence ray having a wavelength of 550 nm, which is represented by Re $(550)=\Delta n_{550} \times d$, is preferably within a range defined by Expression (1). $\Delta n_{550}$ is the refractive index difference resulting from the refractive index anisotropy of the region Z in a case where the wavelength of an incidence ray is 550 nm, and d is the thickness of the circularly polarized light-separating layer 26.

$$200 \text{ nm} \leq \Delta n_{550} \times d \leq 350 \text{ nm} \quad (1)$$

That is, in a case where the in-plane retardation of the plurality of regions Z in the circularly polarized light-separating layer 26, which is represented by Re $(550)=\Delta n_{550} \times d$, satisfies Expression (1), a sufficient amount of circular polarization component of the light incident on the circularly polarized light-separating layer 26 can be converted into circularly polarized light that travels along the forward or reverse direction of the arrow X direction. The in-plane retardation Re $(550)=\Delta n_{550} \times d$ preferably satisfies 225 nm$\leq \Delta n_{550} \times d \leq$340 nm, and more preferably satisfies 250 nm$\leq \Delta n_{550} \times d \leq$330 nm.

Expression (1) is a range for an incidence ray having a wavelength of 550 nm. The in-plane retardation of a plurality of regions Z in the circularly polarized light-separating layer 26 for an incidence ray having a wavelength of $\lambda$ nm, which is represented by Re $(\lambda)=\Delta n_\lambda \times d$, is preferably within a range defined by Expression (1-2) and can be appropriately set.

$$0.7\lambda \text{ nm} \leq \Delta n_\lambda \times d \leq 1.3\lambda \text{ nm} \quad (1\text{-}2)$$

Furthermore, it is also possible to use the value of in-plane retardation of a plurality of regions Z in the circularly polarized light-separating layer 26 that is outside the range of Expression (1). Specifically, in a case where Re (550) is set to satisfy $\Delta n_{550} \times d<200$ nm or 350 nm$<\Delta n_{550} \times d$, the incidence ray can be split into light that travels in the same direction as the traveling direction of the incidence ray and light that travels in a direction different from the traveling direction of the incidence ray. The closer the $\Delta n_{550} \times d$ to 0 nm or 550 nm, the more the components of light that travels in the same direction as the traveling direction of the incidence ray, and the fewer the components of light that travels in a direction different from the traveling direction of the incidence ray.

Furthermore, it is preferable that the in-plane retardation of each of the regions Z in the circularly polarized light-separating layer 26 for an incidence ray having a wavelength of 450 nm, which is represented by Re $(450)=\Delta n_{450} \times d$, and the in-plane retardation of each of the regions Z in the circularly polarized light-separating layer 26 for an incidence ray having a wavelength of 550 nm, which is represented by Re (550)=$\Delta n_{550} \times d$, satisfy Expression (2). $\Delta n_{450}$ is the refractive index difference resulting from the refractive index anisotropy of the region Z in a case where the wavelength of an incidence ray is 450 nm.

$$(\Delta n_{450} \times d)/(\Delta n_{550} \times d) < 1.0 \qquad (2)$$

Expression (2) shows that the liquid crystal compound 30 included in the circularly polarized light-separating layer 26 has reverse dispersion properties. That is, in a case where Expression (2) is satisfied, the circularly polarized light-separating layer 26 can handle incidence rays of broadband wavelengths.

The circularly polarized light-separating member can adjust the angle of refraction of the transmitted lights $L_2$ and $L_5$ by changing one period $\Lambda$ of the liquid crystal alignment pattern formed on the circularly polarized light-separating layer 26. Specifically, the shorter the one period $\Lambda$ of the liquid crystal alignment pattern, the stronger the interference between lights passing through the liquid crystal compounds 30 adjacent to each other, and thus the transmitted light $L_2$ and $L_5$ can be sharply refracted.

The angle of refraction of the transmitted lights $L_2$ and $L_5$ with respect to the incidence rays $L_1$ and $L_4$ varies with the wavelength of the incidence rays $L_1$ and $L_4$ (transmitted lights $L_2$ and $L_5$). Specifically, the longer the wavelength of the incidence ray is, the further the transmitted light is refracted. That is, in a case where the incidence ray is red light, green light, and blue light, the red light is refracted the most and the blue light is refracted the least.

Therefore, in a case where one period $\Lambda$ of the circularly polarized light-separating layer 26 is adjusted according to the wavelength of the incidence ray, the angles of the left-handed circularly polarized light and the right-handed circularly polarized light emitted from the circularly polarized light-separating layer 26 (each of the circularly polarized light-separating members) can be adjusted and coincide with each other.

Specifically, in the liquid crystal alignment pattern of the circularly polarized light-separating layer 26, it is preferable that the longer the wavelength of light to be handled, the longer the one period $\Lambda$ according to the color of the corresponding light. Therefore, in each the circularly polarized light-separating members, the one period $\Lambda$ in the liquid crystal alignment pattern of the circularly polarized light-separating layer 26 is preferably the longest for the R circularly polarized light-separating member 14R, the second longest for the G circularly polarized light-separating member 14G, and the shortest for the B circularly polarized light-separating member 14B. That is, the length of one period $\Lambda$ in the liquid crystal alignment pattern of the circularly polarized light-separating layer 26 constituting each of the circularly polarized light-separating members preferably satisfies "R circularly polarized light-separating member 14R>G circularly polarized light-separating member 14G>B circularly polarized light-separating member 14B".

In other words, the order of sizes of wavelengths of light handled by the R circularly polarized light-separating member 14R, the G circularly polarized light-separating member 14G, and the B circularly polarized light-separating member 14B preferably coincides with the order of lengths of one period $\Lambda$ for these members in the liquid crystal alignment pattern of the circularly polarized light-separating layer 26.

In a case where the members are constituted as above, the angles of the circularly polarized lights emitted from the R circularly polarized light-separating member 14R, the G circularly polarized light-separating member 14G, and the B circularly polarized light-separating member 14B can be made coincide with each other, and circularly polarized lights of the respective colors can be accurately incident on the patterned retardation layer 16. As a result, the light use efficiency which will be described later can be further improved.

The circularly polarized light-separating layer 26 consists a cured layer of a liquid crystal composition including a rod-like liquid crystal compound or a disk-like liquid crystal compound, and has a liquid crystal alignment pattern in which the optical axis of the rod-like liquid crystal compound or the optical axis of the disk-like liquid crystal compound is aligned as described above.

By forming the alignment film 24 on the support 20 as described above, coating the alignment film 24 with a liquid crystal composition, and curing (fixing) the composition by the irradiation with ultraviolet and/or heating or the like, the circularly polarized light-separating layer 26 consisting of a cured layer of the liquid crystal composition can be obtained. The circularly polarized light-separating layer 26 functions as a so-called $\lambda/2$ plate. However, the present invention includes an aspect in which a laminate integrally comprising the support 20 and the alignment film 24 functions as a $\lambda/2$ plate.

The liquid crystal composition for forming the circularly polarized light-separating layer 26 contains a rod-like liquid crystal compound or a disk-like liquid crystal compound, and may further contain other components such as a leveling agent, an alignment control agent, a polymerization initiator, and an alignment aid.

Furthermore, it is desired that the circularly polarized light-separating layer 26 has a wavelength range broader than that of the wavelength of incidence rays. The circularly polarized light-separating layer 26 is preferably constituted with a liquid crystal material having a birefringence inversely dispersed. Furthermore, it is also preferable to add a twisting component to the liquid crystal composition or to laminate different retardation layers such that the wavelength range of the circularly polarized light-separating layer 26 is substantially broader than the wavelengths of incidence rays. For example, JP2014-089476A discloses a method of laminating two liquid crystal layers having different twisted directions so as to realize a patterned broadband $\lambda/2$ plate in the circularly polarized light-separating layer 26. This method is preferably used in the present invention.

—Rod-Like Liquid Crystal Compound—

As the rod-like liquid crystal compound, azomethines, azoxys, cyanobiphenyls, cyanophenyl esters, benzoic acid esters, cyclohexanecarboxylic acid phenyl esters, cyanophenylcyclohexanes, cyano-substituted phenylpyrimidines, alkoxy-substituted phenylpyrimidines, phenyldioxanes, tolans, and alkenylcyclohexylbenzonitriles are preferably used. Not only the low-molecular-weight liquid crystal molecules described above, but also high-molecular-weight liquid crystal molecules can be used.

It is preferable that the alignment of the rod-like liquid crystal compound is fixed by polymerization. As polymerizable rod-like liquid crystal compounds, it is possible to use the compounds described in Makromol. Chem., vol. 190, p. 2255 (1989), Advanced Materials, vol. 5, p. 107 (1993), U.S. Pat. Nos. 4,683,327B, 5,622,648B, 5,770,107B, WO95/022586A, WO95/024455A, WO97/000600A, WO98/023580A, WO98/052905A, JP1989-272551A (JP-H01-

272551A), JP1994-016616A (JP-H06-016616A), JP1995-110469A (JP-H07-110469A), JP1999-080081A (JP-H11-080081A), JP2005-289980A, JP2001-064627A, and the like. Furthermore, as the rod-like liquid crystal compound, for example, those described in JP1999-513019A (JP-H11-513019A), JP2007-279688A, and JP2010-244038A can also be preferably used.

—Disk-Like Liquid Crystal Compound—

As the disk-like liquid crystal compound for example, those described in JP2007-108732A and JP2010-244038A can be preferably used.

Figure 7:
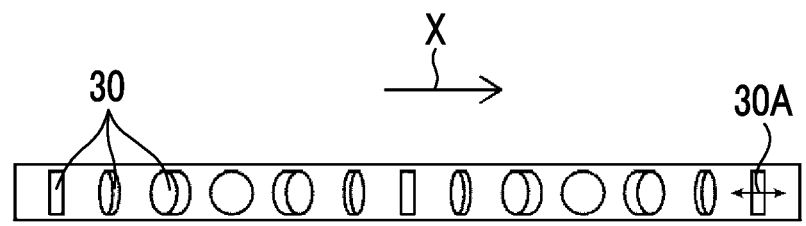
FIG. 7 is a conceptual view for illustrating disk-like liquid crystals.

In a case where the disk-like liquid crystal compound is used for the circularly polarized light-separating layer 26, the liquid crystal compound 30 rises in the thickness direction of the circularly polarized light-separating layer 26, and the optical axis 30A derived from the liquid crystal compound is defined as an axis perpendicular to the plane of the disk, which is so-called fast axis (see FIG. 7).

<Patterned Retardation Layer>

The patterned retardation layer 16 is a λ/4 plate that converts the circularly polarized light, which is separated by the circularly polarized light-separating layer 26 of each of the circularly polarized light-separating members, into linearly polarized light. The circularly polarized light-separating members are the R circularly polarized light-separating member 14R, the G circularly polarized light-separating member 14G, and the B circularly polarized light-separating member 14B.

In the optical device 10 according to the embodiment of the present invention, the patterned retardation layer 16 has in-plane retardation constant at λ/4 in the entire plane thereof and has a plurality of regions where slow axes are in different directions in the same plane. Specifically, the patterned retardation layer 16 has two regions consisting of a first region 16a (+λ/4 region) having a slow axis forming an angle of +45° with the transmission axis of the polarizer 18 and a second region 16b (−λ/4 region) having a slow axis forming an angle of −45° with the transmission axis of the polarizer 18.

The λ/4 plate is a plate having a function of converting circularly polarized light having a specific wavelength into linearly polarized light or converting linearly polarized light into circularly polarized light. More specifically, the λ/4 plate is a plate in which a value of in-plane retardation at a predetermined wavelength λ nm is represented by Re (λ)=λ/4 (or an odd multiple thereof). This equation may be satisfied at any wavelength in the visible light region (for example, 550 nm). In a case where the patterned retardation layer 16 is supported, for example, by the same support as the support 20 described above, the patterned retardation layer 16 as a λ/4 plate means that both the patterned retardation layer 16 and the support 20 function as the λ/4 plate.

In each region of the patterned retardation layer 16, the in-plane retardation at a wavelength of 550 nm, which is represented by Re (550)=$\Delta n_{550} \times d$, is not particularly limited. However, Re (550) is preferably 115 to 165 nm, more preferably 120 to 150 nm, and even more preferably 125 to 145 nm.

As described above, the patterned retardation layer 16 has in-plane retardation constant at λ/4 in the entire plane, and includes the first region 16a having a slow axis forming an angle of +45° with the transmission axis (transverse direction in the drawing) of the polarizer 18 and the second region 16b having a slow axis forming an angle of −45° with the transmission axis of the polarizer 18.

That is, the patterned retardation layer 16 has a pattern having a +λ/4 region and a −λ/4 region. In this example, in a case where the patterned retardation layer 16 is observed from the side of the polarizer 18, based on the transmission axis of the polarizer 18, the clockwise direction is represented by "+", and the counterclockwise direction is represented by "−".

In the patterned retardation layer 16, the first region 16a is a region for right-handed circularly polarized light separated by each of the circularly polarized light-separating layers 26 of the R circularly polarized light-separating member 14R, the G circularly polarized light-separating member 14G, and the B circularly polarized light-separating member 14B. That is, because the first region 16a has a slow axis forming an angle of +45° with the transmission axis of the polarizer 18, the first region 16a converts the right-handed circularly polarized light separated by the circularly polarized light-separating layer 26 into linearly polarized light in the direction of the transmission axis of the polarizer 18.

In contrast, in the patterned retardation layer 16, the second region 16b is a region for left-handed circularly polarized light separated by each of the circularly polarized light-separating layers 26 of the R circularly polarized light-separating member 14R, the G circularly polarized light-separating member 14G, and the B circularly polarized light-separating member 14B. That is, because the second region 16b has a slow axis forming an angle of −45° with the transmission axis of the polarizer 18, the second region 16b converts the left-handed circularly polarized light separated by the circularly polarized light-separating layer 26 into linearly polarized light in the direction of the transmission axis of the polarizer 18.

The position in the patterned retardation layer 16 on which the left-handed circularly polarized light and the right-handed circularly polarized light separated by the R circularly polarized light-separating member 14R, the G circularly polarized light-separating member 14G, and the B circularly polarized light-separating member 14B will be incident varies with the position of the light emitting portions in the organic EL substrate 12, that is, the arrangement of the light emitting portions.

Therefore, the pattern of the first region 16a and the second region 16b to be formed in the patterned retardation layer 16 may be appropriately set according to the positions of the light emitting portions in the organic EL substrate 12, such that the right-handed circularly polarized light emitted from the light emitting portions and separated by the R circularly polarized light-separating member 14R, the G circularly polarized light-separating member 14G, and the B circularly polarized light-separating member 14B is incident on the first region 16a, and the left-handed circularly polarized light emitted from the light emitting portions and separated by the above members is incident on the second region 16b.

In addition, the position in the patterned retardation layer 16 on which the left-handed circularly polarized light and the right-handed circularly polarized light separated by the R circularly polarized light-separating member 14R, the G circularly polarized light-separating member 14G, and the B circularly polarized light-separating member 14B will be incident is also affected by the refraction of light by each of the circularly polarized light-separating members, that is, one period Λ of the circularly polarized light-separating layer 26.

Furthermore, the position in the patterned retardation layer 16 on which the left-handed circularly polarized light and the right-handed circularly polarized light separated by the R circularly polarized light-separating member 14R, the G circularly polarized light-separating member 14G, and the B circularly polarized light-separating member 14B will be incident is also affected by the distance between the circularly polarized light-separating member (circularly polarized light-separating layer 26) and the patterned retardation layer 16.

Therefore, it is preferable that the pattern of the first region 16a and the second region 16b to be formed in the patterned retardation layer 16 is appropriately set in consideration of the positions of the light emitting portions in the organic EL substrate 12 as well as one period Λ of the liquid crystal alignment pattern of the circularly polarized light-separating layer 26 and/or the distance between the circularly polarized light-separating member and the patterned retardation layer 16, such that the right-handed circularly polarized light emitted from the light emitting portions and separated by the R circularly polarized light-separating member 14R, the G circularly polarized light-separating member 14G, and the B circularly polarized light-separating member 14B is incident on the first region 16a, and the left-handed circularly polarized light emitted from the light emitting portions and separated by the above members is incident on the second region 16b.

It is preferable to form the patterned retardation layer 16 by using a liquid crystal compound.

In a case where the patterned retardation layer 16 is formed using a liquid crystal compound, the pattern of the first region 16a and the second region 16b and the direction of the slow axis in each pattern can be controlled with high accuracy and high resolution.

Examples of the method of forming the patterned retardation layer 16 include a method of fixing a liquid crystal compound in an aligned state.

As the liquid crystal compound, it is possible to use those exemplified above regarding the formation of the circularly polarized light-separating layer 26.

In order to keep the in-plane retardation of the patterned retardation layer 16 within the above range, sometimes the alignment state of the liquid crystal compound is controlled. At this time, in a case where a rod-like liquid crystal compound is used, it is preferable to fix the rod-like liquid crystal compound in a horizontally aligned state. In a case where a disk-like liquid crystal compound is used, it is preferable to fix the disk-like liquid crystal compound in a vertically aligned state. In the present invention, "horizontal alignment of the rod-shaped liquid crystal compound" means that the director of the rod-like liquid crystal compound is parallel to the surface of the layer. Furthermore, in the present invention, "vertical alignment of the disk-like liquid crystal compound" means that the disk surface of the disk-like liquid crystal compound is perpendicular to the surface of the layer.

"Horizontal" and "vertical" do not mean that the liquid crystal compounds need to be precisely horizontally or vertically aligned, but means that there may be a difference within a range of 20° from the precise angle. The difference is preferably within ±5°, more preferably within ±3°, even more preferably within ±2°, and most preferably within ±1°.

In order to vertically or horizontally align the liquid crystal compounds, an additive (alignment control agent) facilitating the horizontal alignment or the vertical alignment may be used. As the additive, known additives can be used.

The patterned retardation layer 16 may be formed by known methods.

Examples thereof include the method described in JP2012-150428A, the method described in paragraphs "0017" to "0029" of JP2012-008170A, the method described IN paragraphs "0166" to "0181" of JP2012-032661A, and the method described in paragraphs "0039" to "0041" of JP2014-089431A.

The thickness of the patterned retardation layer 16 is not particularly limited. However, in order to make a thinner patterned retardation layer 16, the thickness is preferably 1 to 5 μm, more preferably 1 to 4 μm, and even more preferably 1 to 3 μm.

<Polarizer>

The polarizer 18 is provided on the light emission side of the patterned retardation layer 16.

The polarizer (polarizing plate) 18 is a known linear polarizer having a unidirectional transmission axis and used for an antireflection film of an organic EL display and the like.

Therefore, as the polarizer 18, it is possible to use various general linear polarizers such as an absorption-type polarizer including an iodine compound and a reflection-type polarizer such as a wire grid.

As described above, the polarizer 18 has, for example, a transmission axis in the transverse direction of FIG. 1.

<Action of Optical Device>

Hereinafter, the action of the optical device 10 will be described.

As described above, the transmission axis of the polarizer 18 is in the transverse direction in the drawing. Accordingly, in a case where external light E is incident on the optical device 10 according to the embodiment of the present invention, the component of linearly polarized light in the transverse direction of the drawing is transmitted through the polarizer 18, and other components of linearly polarized light are absorbed into the polarizer 18.

The linearly polarized light transmitted through the polarizer 18 is converted into circularly polarized light by the patterned retardation layer 16. The sense of rotation of the circularly polarized light depends on the position of incidence in the patterned retardation layer 16. The light incident on the first region 16a is converted into right-handed circularly polarized light, and the light incident on the second region 16b is converted into left-handed circularly polarized light.

The circularly polarized light converted from the external light E is reflected from the metallic reflecting portion of the non-light emitting portion 12N of the organic EL substrate 12, undergoes reversal of sense of rotation, is incident on the patterned retardation layer 16, and converted into linearly polarized light. The sense of rotation of the circularly polarized light, which is reflected from the metallic reflecting portion of the organic EL substrate 12 and incident on the patterned retardation layer 16, is opposite to the sense of rotation of the circularly polarized light emitted from the patterned retardation layer 16 as a result of transmission of the external light E as incidence ray through the polarizer 18. Therefore, the light converted into the linearly polarized light by the patterned retardation layer 16 is linearly polarized light in the direction orthogonal to the transmission axis of the polarizer, and thus cannot be transmitted through the patterned retardation layer 16. That is, the optical device 10 according to the embodiment of the present invention can prevent reflection of external light.

On the other hand, in the optical device 10 according to the embodiment of the present invention, the light emitted from the R light emitting portion 12R of the organic EL substrate 12 is incident on the R circularly polarized light-separating member 14R, the light emitted from the G light emitting portion 12G is incident on the G circularly polarized light-separating member 14G, and the light emitted from the B light emitting portion 12B is incident on the B circularly polarized light-separating member 14B.

The light (non-polarized light) incident on each of the circularly polarized light-separating members is separated into a component of right-handed circularly polarized light and a component of left-handed circularly polarized light by the circularly polarized light-separating layer 26 of the circularly polarized light-separating members. The right-handed circularly polarized light (thick broken line) is emitted to the left in the drawing, and the left-handed circularly polarized light (fine broken line) is emitted to the right in the drawing.

The right-handed circularly polarized light separated by the circularly polarized light-separating layer 26 is incident on the first region 16a of the patterned retardation layer 16 as a $\lambda/4$ plate. The first region 16a has a slow axis forming an angle of $+45°$ with the transmission axis of the polarizer 18 ($+\lambda/4$). Therefore, the right-handed circularly polarized light incident on the first region 16a is converted into linearly polarized light in the direction of the transmission axis of the polarizer 18.

In contrast, the left-handed circularly polarized light separated by the circularly polarized light-separating layer 26 is incident on the second region 16b of the patterned retardation layer 16 as a $\lambda/4$ plate. The second region 16b has a slow axis forming an angle of $-45°$ with the transmission axis of the polarizer 18 ($-\lambda/4$). Therefore, the left-handed circularly polarized light incident on the second region 16b is also converted into linearly polarized light in the direction of the transmission axis of the polarizer 18.

The light transmitted through the patterned retardation layer 16 is then incident on the polarizer 18. As described above, the light transmitted through the patterned retardation layer 16 is converted into linearly polarized light in the direction of the transmission axis of the polarizer 18. Therefore, all the light incident on the polarizer 18 is transmitted through the polarizer 18 and emitted (arrow) from the optical device 10.

As described above, the optical device 10 according to the embodiment of the present invention can emit both the component of right-handed circularly polarized light and component of left-handed circularly polarized light emitted from the light emitting portions of the organic EL substrate 12. Therefore, the optical device 10 can greatly improve the light use efficiency compared to the conventional organic EL device absorbing either right-handed circularly polarized light or left-handed circularly polarized light by using a $\lambda/4$ plate and a polarizer.

That is, according to the optical device of the embodiment of the present invention, both the prevention of external light reflection and the improvement of utilization efficiency of light by organic EL can be accomplished in an organic EL display device and the like, and high contrast display can be performed, for example, in an organic EL display device.

Other Embodiments

The optical device 10 shown in FIG. 1 is provided with the R circularly polarized light-separating member 14R, the G circularly polarized light-separating member 14G, and the B circularly polarized light-separating member 14B for the R light emitting portion 12R, the G light emitting portion 12G, and the B light emitting portion 12B of the organic EL substrate 12 respectively. In a preferred aspect, the circularly polarized light-separating members have the circularly polarized light-separating layers 26 among which one period $\Lambda$ varies such that the order of sizes of wavelengths of the corresponding light coincides with the order of lengths of one period $\Lambda$ of the liquid crystal alignment pattern.

The present invention is not limited to the above. For example, for all the light emitting portions of the organic EL substrate 12, one circularly polarized light-separating member may be provided in which one period $\Lambda$ of the liquid crystal alignment pattern of the circularly polarized light-separating layer is uniform in the entirety of the layer.

However, considering the light use efficiency obtained in a case where the optical device according to the embodiment of the present invention is used as an organic EL display device or the like, it is preferable that the circularly polarized light-separating member adjusts one period $\Lambda$ of the circularly polarized light-separating layer for all the light emitting portions according to the wavelength of light to be emitted.

Figure 8:
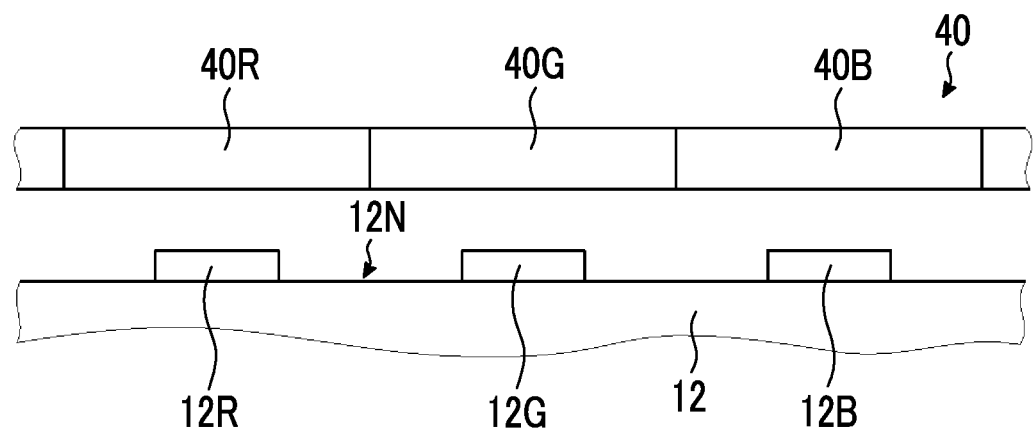
FIG. 8 is a conceptual view for illustrating another example of the optical device according to the embodiment of the present invention.

For example, just as a circularly polarized light-separating member 40 conceptually illustrated in FIG. 8, it is preferable that the optical device is provided with an R circularly polarized light-separating region 40R, a G circularly polarized light-separating region 40G, and a B circularly polarized light-separating region 40B for the R light emitting portion 12R, the G light emitting portion 12G, and the B light emitting portion 12B of the organic EL substrate 12 respectively, and the circularly polarized light-separating regions preferably have circularly polarized light-separating layers among which one period $\Lambda$ varies such that the order of sizes of wavelengths of the corresponding light coincides with the order of lengths of one period $\Lambda$ of the liquid crystal alignment pattern.

The circularly polarized light-separating member 40 can be prepared as below for example.

In a case where an alignment film is exposed using the exposure device 60 shown in FIG. 6, the area of the R circularly polarized light-separating region 40R is exposed in a state where other regions are shielded from light by masking. Then, the intersecting angle $\alpha$ of the two light rays MA and MB is changed, and the area of the G circularly polarized light-separating region 40G of the alignment film is exposed in a state where other regions are shielded from light by masking. Thereafter, the intersecting angle $\alpha$ of the two light rays MA and MB is changed, and the area of the B circularly polarized light-separating region 40B of the alignment film is exposed in a state where other regions are shielded from light by masking, thereby forming an alignment film.

In this way, by forming the circularly polarized light-separating layer on the alignment film exposed by changing the intersecting angle $\alpha$ of two light rays MA and MB for each of the R circularly polarized light-separating region 40R, the G circularly polarized light-separating region 40G, and the B circularly polarized light-separating region 40B, it is possible to prepare a circularly polarized light-separating member shown in FIG. 8 in which one period $\Lambda$ varies with the regions according to the respective light emitting portions.

Figure 9:
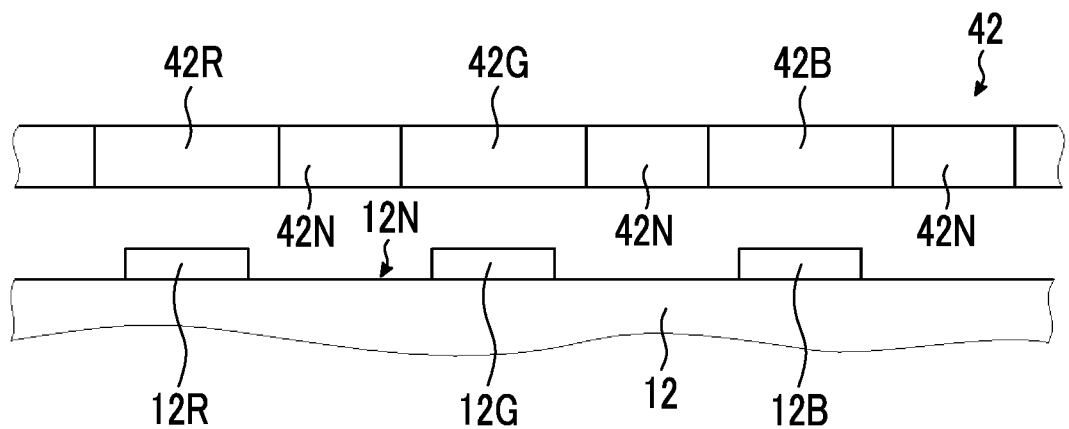
FIG. 9 is a conceptual view for illustrating another example of the optical device according to the embodiment of the present invention.

Furthermore, in a case where one circularly polarized light-separating member is provided for all the light emitting portions, and one period $\Lambda$ of the circularly polarized light-separating layer is adjusted for each region according to the wavelength of light, just as a circularly polarized light-separating member 42 conceptually illustrated in FIG. 9, the portion on which the light from the light emitting portion is not incident preferably has an isotropic region 42N, in which no liquid crystal compound is aligned, between the circularly polarized light-separating regions.

The circularly polarized light-separating layer formed by aligning liquid crystal compounds has a slightly high haze. Therefore, in a case where external light is incident on the circularly polarized light-separating layer, the external light is likely to be scattered, and consequently, the incident external light is likely to be partially transmitted through the patterned retardation layer 16 and the polarizer 18 and emitted from the optical device, and thus the performance of preventing external light reflection is likely to deteriorate.

On the other hand, in a case where the portion, on which the light from the light emitting portion is not incident, between an R circularly polarized light-separating region 42R and a G circularly polarized light-separating region 42G, between the G circularly polarized light-separating region 42G and a B circularly polarized light-separating region 42B, and between the R circularly polarized light-separating region 42R and the B circularly polarized light-separating region 42B is provided as the isotropic region 42N in which no liquid crystal compound is aligned, the scattering of external light in the portion on which the light from the light emitting portion is not incident is prevented, and a higher performance of preventing external light reflection is obtained.

The circularly polarized light-separating member 42 having the isotropic region 42N shown in FIG. 9 can be prepared as below for example.

First, just as the circularly polarized light-separating member 40 shown in FIG. 8, masking is performed, and an alignment film is exposed using the exposure device 60 shown in FIG. 6 by changing the intersecting angle α of two light rays MA and MB.

Then, as described above, the alignment film is coated with a liquid crystal composition that will become a circularly polarized light-separating layer, and the liquid crystal composition is irradiated with ultraviolet rays in a state where a region corresponding to the isotropic region 42N is masked, such that circularly polarized light-separating regions are exposed. Thereafter, the mask is removed, and the whole surface of the layer is secondly irradiated with ultraviolet rays with heating such that the circularly polarized light-separating regions and the isotropic region 42N are cured (fixed). In this way, a circularly polarized light-separating member 42 (circularly polarized light-separating layer) is obtained which has circularly polarized light-separating regions having a liquid crystal alignment pattern and the isotropic region 42N in which no liquid crystal compound is aligned.

As a method of forming the circularly polarized light-separating member 42 having the isotropic region 42N shown in FIG. 9, the following method can also be used. First, in the process of performing masking and exposing the alignment film by using the exposure device 60 shown in FIG. 6 by changing the intersecting angle α of two light rays MA and MB so as to form the circularly polarized light-separating member 40 shown in FIG. 8, the size of the light transmission portion of the mask corresponding to the areas of the R circularly polarized light-separating region 42R, the G circularly polarized light-separating region 42G, and the B circularly polarized light-separating region 42B is slightly reduced.

In this way, the area corresponding to the isotropic region 42N of the alignment film is shielded from light all the time and is not exposed, while the area corresponding to each of the circularly polarized light-separating regions is exposed. As a result, an alignment film is formed which does not have an alignment pattern in the area corresponding to the isotropic region 42N but has an alignment pattern in the area corresponding to each of the circularly polarized light-separating regions. In a case where a circularly polarized light-separating layer is formed on the alignment film that does not have an alignment pattern in the area corresponding to the isotropic region 42N, it is also possible to form the circularly polarized light-separating member 42 (circularly polarized light-separating layer) including circularly polarized light-separating regions having a liquid crystal alignment pattern and the isotropic region 42N in which no liquid crystal compound is aligned.

In the optical device according to the embodiment of the present invention, the circularly polarized light-separating member, the patterned retardation layer 16, and the polarizer 18 can be integrally formed.

Figure 10:
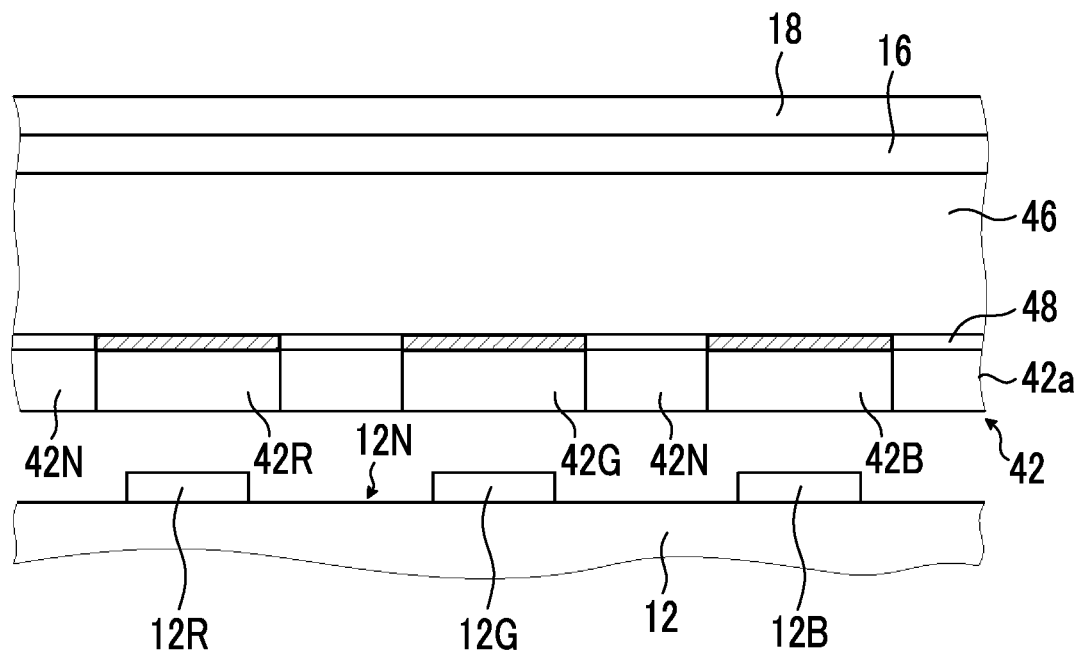
FIG. 10 is a conceptual view for illustrating another example of the optical device according to the embodiment of the present invention.

For example, as illustrated above by using the circularly polarized light-separating member 42 in FIG. 10, for example, the optical device is constituted with the circularly polarized light-separating member 42, which is on one surface of a support 46 and consists of an alignment film 48 and a circularly polarized light-separating layer 42a, and the patterned retardation layer 16 and the polarizer 18 which are on the other surface of the support 46. In the alignment film 48, the shaded portion is a region where an alignment pattern is formed by the exposure device 60, and the white portion is a non-alignment region where no alignment pattern is formed.

As the support 46, it is possible to use various materials exemplified above as the support 20. In the above constitution, the thickness of the support 46 substantially equals the distance between the circularly polarized light-separating layer and the patterned retardation layer 16 described above. Accordingly, the thickness of the support 46 may be appropriately set according to the distance between the circularly polarized light-separating layer and the patterned retardation layer 16.

In the optical device 10 shown in FIG. 1, the first region 16a and the second region 16b of the patterned retardation layer 16 are provided for one circularly polarized light-separating member (one light emitting portion), but the present invention is not limited thereto. That is, a plurality of circularly polarized light-separating members may share one region of the patterned retardation layer 16.

For example, in the optical device 10, the direction of rotation of the optical axis 30A of the liquid crystal compound 30 in the circularly polarized light-separating layer 26 of the R circularly polarized light-separating member 14R is opposite to the direction of rotation of the optical axis 30A of the liquid crystal compound 30 in the circularly polarized light-separating layer 26 of the G circularly polarized light-separating member 14G. In this way, for example, the left-handed circularly polarized lights emitted from the two circularly polarized light-separating members may be caused to travel along a direction in which the lights approach each other, such that the left-handed circularly polarized lights emitted from the two circularly polarized light-separating members are incident on one second region 16b of the patterned retardation layer 16 and converted into linearly polarized light.

The optical device according to the embodiment of the present invention may be prepared, for example, by providing one more circularly polarized light-separating member (circularly polarized light-separating layer 26) between the circularly polarized light-separating member and the patterned retardation layer 16 in the optical device 10 shown in FIG. 1.

In the optical device 10 shown in FIG. 1, the linearly polarized light emitted from the polarizer 18 is emitted not in the front direction but in an oblique direction (solid line in FIG. 1). "Front" means the normal direction, that is, a direction orthogonal to the main surface.

On the other hand, in a case where one more circularly polarized light-separating member is provided between the circularly polarized light-separating member and the patterned retardation layer 16, the traveling direction of light can be refracted by the second circularly polarized light-separating member, and the light emitted from the polarizer 18 can be emitted to the front.

Furthermore, in order to improve viewing angle characteristics and the like, the optical device 10 according to the embodiment of the present invention may be provided with a birefringent layer for correcting viewing angle that is disposed in the middle of the optical path, for example, an optical compensation film having retardation in an in-plane direction or an out-of-plane direction.

Hitherto, the optical device according to the embodiment of the present invention has been specifically described. However, the present invention is not limited to the examples described above. It goes without saying that the present invention may be ameliorated or modified in various ways, within a scope that does not depart from the gist of the present invention.

EXAMPLES

Hereinafter, the features of the present invention will be more specifically described based on examples. The materials, reagents, amounts thereof used, amount of substances, ratios, details of treatments, procedures of treatments, and the like shown in the following examples can be appropriately changed as long as the gist of the present invention is maintained. Accordingly, the scope of the present invention should not be limited to the specific examples described below.

Example 1

<Preparation of Organic EL Substrate>

A commercially available organic EL display device (manufactured by SAMSUNG, SC-04E) including an R light emitting portion (red organic electroluminescent layer), a G light emitting portion (green organic electroluminescent layer), and a B light emitting portion (blue organic electroluminescent layer) was prepared.

From this organic EL display device, a polarizing plate and an optical film were removed, and the surface of a barrier layer protecting a light emitting element was exposed. The substance obtained in this way was used as an organic EL substrate.

In this organic EL substrate, the R light emitting portion has an emission spectrum with a central wavelength of 650 nm and an emission bandwidth of 50 nm, the G light emitting portion has an emission spectrum with a central wavelength of 550 nm and an emission bandwidth of 45 nm, and the B light emitting portion has an emission spectrum with a central wavelength of 450 nm and an emission bandwidth of 40 nm.

<Preparation of Support>

As a support, an acrylic film was prepared using the method described in WO2017/033468A. The thickness of the prepared support was 40 μm, and the value of in-plane and out-of-plane retardation (Re) of the support was zero.

<Formation of Photo Alignment Film>

One surface of the support was coated with 1% by mass aqueous solution of a photo alignment material E-1 having the following structure and dried for 1 minute at 100° C.

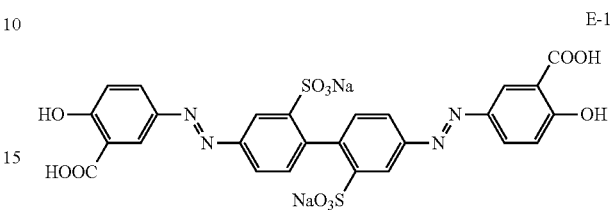

E-1

The obtained coating film was irradiated with ultraviolet rays in the following manner by using an air-cooled metal halide lamp at 160 W/cm$^2$ (manufactured by EYE GRAPHICS Co., Ltd.) in the air, thereby preparing a support with a photo alignment film.

First, the photo alignment film was exposed through a wire grid polarizer (manufactured by MOXTEK, Inc., Pro-Flux ppL02) and a mask A having a portion corresponding to a first region of a patterned retardation layer as a light transmission portion.

The mask A was prepared such that according to each of the R light emitting portion, the G light emitting portion, and the B light emitting portion of the aforementioned organic EL substrate, the regions irradiated with right-handed circularly polarized light separated by the circularly polarized light-separating member (circularly polarized light-separating layer), which will be described later, functioned as light (ultraviolet rays) transmission portions, and other regions functioned as light shielding portions.

Thereafter, the photo alignment film was exposed through a wire grid polarizer and a mask B which had a light transmission portion and a light shielding portion opposite to those of the mask A and had a portion corresponding to a second region of the patterned retardation layer as a light transmission portion. At this time, the wire grid polarizer was disposed such that the transmission axis thereof was orthogonal to the transmission axis in the exposure using the mask A.

As described above, the mask patterns of the mask A and the mask B were formed according to the light emitting portions of the respective colors of the organic EL substrate (see the mask shown in FIG. 11). The mask patterns were formed such that the size of the regions corresponding to the light emitting portions was 20 to 50 μm and the pitch of the regions corresponding to the light emitting portions was 70 to 100 μm.

For the exposure of the photo alignment film, the distance between the surface of the exposure mask and the photo alignment film was set to 200 μm. Furthermore, the illuminance of the ultraviolet rays was 100 mW/cm$^2$ in the UV-A region (adding up wavelengths of 380 to 320 nm), and the irradiation amount was 1,000 mJ/cm$^2$ in the UV-A region.

<Formation of Patterned Retardation Layer>

The following composition for a patterned retardation layer was prepared.

(Composition for Patterned Retardation Layer)

| | |
|---|---|
| The following rod-like liquid crystal compound (manufactured by BASF SE, LC242) | 100 parts by mass |
| The following horizontal alignment agent A | 0.3 parts by mass |
| Photopolymerization initiator (manufactured by BASF SE, IRGACURE 907) | 3.3 parts by mass |
| Sensitizer (manufactured by Nippon Kayaku Co., Ltd., KAYACURE-DETX) | 1.1 parts by mass |
| Methyl ethyl ketone | 300 parts by mass |

Rod-like liquid crystal LC242: rod-like liquid crystal described in WO2010/090429A2

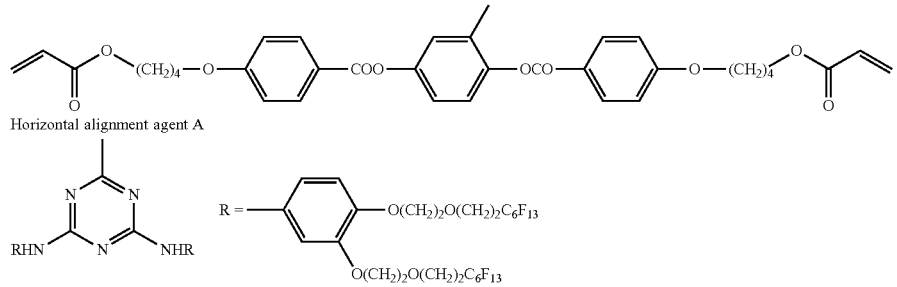

Horizontal alignment agent A

The prepared composition for a patterned retardation layer was filtered through a polypropylene filter having a pore size of 0.2 μm.

The photo alignment film of the support with a photo alignment film was coated with the filtered composition for a patterned retardation layer, and the composition was dried for 2 minutes at a film surface temperature of 105° C. such that the composition was in a state of liquid crystalline phase. Then, the composition was cooled to 75° C., irradiated with ultraviolet rays in the air by using an air-cooled metal halide lamp (manufactured by EYE GRAPHICS Co., Ltd.) at 160 W/cm$^2$ such that the alignment state thereof is fixed, thereby preparing a patterned retardation layer having patterned first and second regions on a support.

The film thickness of the patterned retardation layer was 1.3 μm. In addition, the first and second regions both have Re (550) of 130 nm, and the in-plane slow axes of these regions were orthogonal to each other.

<Bonding of Polarizer>

By using an adhesive (manufactured by Soken Chemical & Engineering Co., Ltd., SK-DYNE 2057), a wire grid polarizer (manufactured by MOXTEK, Inc., ProFlux PPL02) was bonded to the patterned retardation layer.

At this time, the patterned retardation layer and the wire grid polarizer were positioned such that the slow axis of the first region (+λ/4) of the patterned retardation layer intersected with the transmission axis of the wire grid polarizer at +45°, and the slow axis of the second region (−λ/4) of the patterned retardation layer intersected with the transmission axis of the wire grid polarizer at −45°.

<Preparation of Circularly Polarized Light-Separating Member>

A surface of the support opposite to the surface, on which the patterned retardation layer was formed, was continuously coated with the following coating solution for forming an undercoat layer by using a #8 wire bar. The support on which the coating film was formed was dried with hot air for 60 seconds at 60° C. and then further dried with hot air for 120 seconds at 100° C., thereby forming an undercoat layer.

(Coating Solution for Forming Undercoat Layer)

| | |
|---|---|
| The following modified polyvinyl alcohol | 2.40 parts by mass |
| Isopropyl alcohol | 1.60 parts by mass |
| Methanol | 36.00 parts by mass |
| Water | 60.00 parts by mass |

Modified polyvinyl alcohol

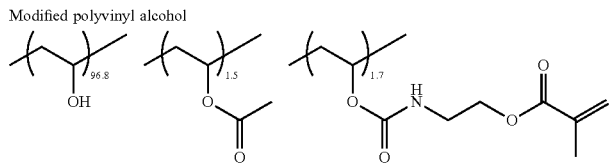

<<Formation of Alignment Film>>

The support on which the undercoat layer was formed was continuously coated with the following coating solution for forming an alignment film by using a #2 wire bar. The support on which the coating film of the coating solution for forming an alignment film was formed was dried on a hot plate for 60 seconds at 60° C., thereby forming an alignment film.

(Coating Solution for Forming Alignment Film)

| | |
|---|---|
| The following material A for photo alignment | 1.00 part by mass |
| Water | 16.00 parts by mass |

| | |
|---|---|
| Butoxy ethanol | 42.00 parts by mass |
| Propylene glycol monomethyl ether | 42.00 parts by mass |

Material A for photo alignment-

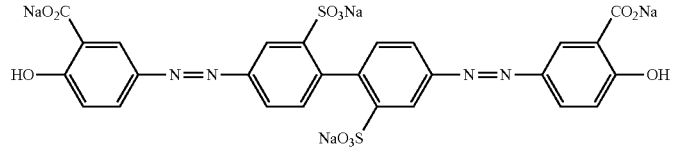

<<Exposure of Alignment Film>>

The alignment film was exposed using the exposure device shown in FIG. 6, thereby forming an alignment film having an alignment pattern.

In the exposure device, a laser that emits laser beam having a wavelength (325 nm) was used. The exposure amount by the interference light was set to 100 mJ/cm². One period (a length over which an optical axis derived from a liquid crystal compound rotates) 180° of the alignment pattern formed by two laser beams and interference was controlled by changing the intersecting angle (intersecting angle α) of two lights.

<<Formation of Circularly Polarized Light-Separating Layer>>

A liquid crystal composition LC-1 shown below was prepared.

(Liquid Crystal Composition LC-1)

| | |
|---|---|
| The following rod-like liquid crystal compound L-1 | 19.57 parts by mass |
| The following horizontal alignment agent T-1 | 0.015 parts by mass |
| Photopolymerization initiator (manufactured by BASF SE, IRGACURE 907) | 0.587 parts by mass |
| Photosensitizer (manufactured by Nippon Kayaku Co., Ltd., KAYACURE DETX-S) | 0.916 parts by mass |
| Polymerization control agent (manufactured by BASF SE, IRGANOX1076) | 0.078 parts by mass |
| Methyl ethyl ketone | 80.0 parts by mass |

Rod-like liquid crystal compound L-1

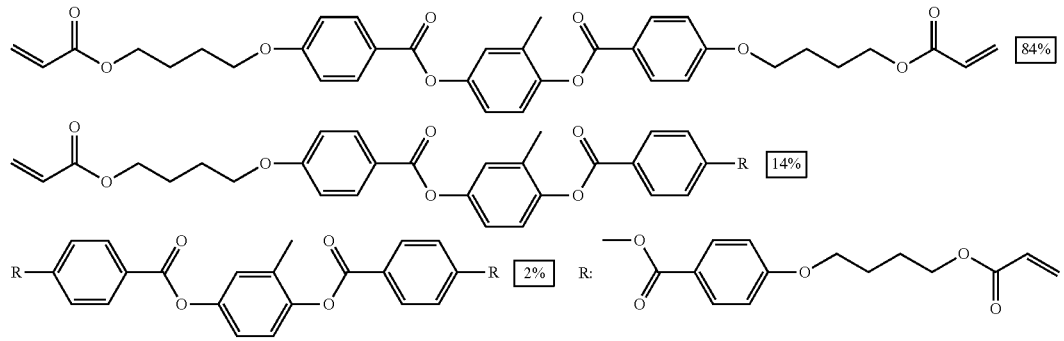

Horizontal alignment agent T-1

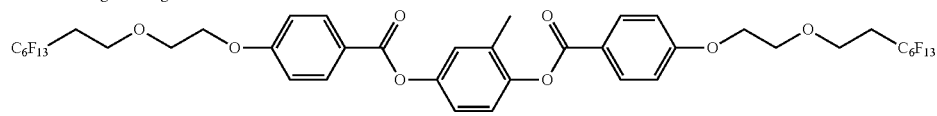

The alignment film having undergone exposure was coated with the prepared liquid crystal composition LC-1. Thereafter, the liquid crystal composition LC-1 was allowed to age by being heated at a film surface temperature of 95° C. for 60 seconds and then immediately exposed in the air at 25° C. by using an ultrahigh-pressure mercury lamp (manufactured by Canon Inc., PLA-501F exposure machine) at an exposure amount of 100 mJ/cm², thereby forming a circularly polarized light-separating layer.

In this way, a laminate was prepared which had a patterned retardation layer and a polarizer on one surface of a support and had a circularly polarized light-separating member on the other surface of the support (see FIG. 10).

By using a polarizing microscope, it was confirmed that the circularly polarized light-separating member had Re (550) of 275 nm and a periodic alignment surface shown in FIG. 3. In the liquid crystal alignment pattern of the circularly polarized light-separating layer, one period in which the optical axis derived from the liquid crystal compound rotates 180° was 1 μm.

The prepared laminate and the organic EL substrate prepared in advance were combined by positioning the R light emitting portion, the G light emitting portion, and the B light emitting portion of the organic EL substrate and the first region and the second region of the patterned retardation layer, thereby preparing the optical device according to an embodiment of the present invention.

Example 2

For performing exposure by using the exposure device shown in FIG. 6 so as to form an alignment film for forming a circularly polarized light-separating layer, first, an alignment film was exposed through a mask in which only a region corresponding to an R light emitting portion of an organic EL substrate is a light transmission portion and other regions are light shielding portions.

Then, the intersecting angle α of two light rays MA and MB was changed, and the alignment film was exposed through a mask in which only a region corresponding to a G light emitting portion of the organic EL substrate is a light transmission portion and other regions are light shielding portions.

Thereafter, the intersecting angle α of two light rays MA and MB was changed, and the alignment film was exposed through a mask in which only a region corresponding to a B light emitting portion of the organic EL substrate is a light transmission portion and other regions are light shielding portions.

An optical device according to an embodiment of the present invention was prepared by preparing a circularly polarized light-separating member in the same manner as in Example 1, except that the exposure in the process of forming an alignment film for forming a circularly polarized light-separating layer was performed as above.

By using a polarizing microscope, it was confirmed that the circularly polarized light-separating member had Re (550) of 275 nm and a periodic alignment surface shown in FIG. 3. Here, as being conceptually shown in FIG. 8, the prepared circularly polarized light-separating member had an R circularly polarized light-separating region, a G circularly polarized light-separating region, and a B circularly polarized light-separating region among which one period, in which the optical axis derived from the liquid crystal compound of the liquid crystal alignment pattern rotates 180°, varies.

In the circularly polarized light-separating layer of the circularly polarized light-separating member, one period in which the optical axis rotates 180° was 1.44 μm for the R circularly polarized light-separating region, 1.22 μm for the G circularly polarized light-separating region, and 1 μm for the B circularly polarized light-separating region.

Example 3

An alignment film was exposed in the same manner as in Example 2, thereby forming an alignment film for forming a circularly polarized light-separating layer.

The alignment film was coated with the liquid crystal composition LC-1 in the same manner as in Example 1.

Thereafter, the liquid crystal composition LC-1 was allowed to age by being heated at a film surface temperature of 95° C. for 60 seconds and then immediately exposed through the mask shown in FIG. 11 in the air at 25° C. by using an ultrahigh-pressure mercury lamp (manufactured by Canon Inc., PLA-501F exposure machine) at an exposure amount of 100 mJ/cm².

In the mask shown in FIG. 11, the portion of the gridded region A is a light shielding portion, and other regions R, G, and B are light transmission portions. The regions R, G, and B correspond to the positions of the R light emitting portion, the G light emitting portion, and the B light emitting portion of the organic EL substrate respectively.

Then, the mask was removed, and while the entirety of the composition was being heated for 5 minutes at 200° C., the whole surface of the liquid crystal composition LC-1 was exposed again in nitrogen by using an air-cooled metal halide lamp (manufactured by EYE GRAPHICS Co., Ltd.) at an exposure amount of 500 mJ/cm², thereby forming a circularly polarized light-separating layer.

An optical device according to an embodiment of the present invention was prepared in the same manner as in Example 1, except that the circularly polarized light-separating member was formed in this manner.

By using a polarizing microscope, it was confirmed that the circularly polarized light-separating member had Re (550) of 275 nm and a periodic alignment surface shown in FIG. 3. Here, as being conceptually shown in FIGS. 9 and 10, the prepared circularly polarized light-separating member had an isotropic region in which no liquid crystals are aligned, in addition to an R circularly polarized light-separating region, a G circularly polarized light-separating region, and a B circularly polarized light-separating region among which one period, in which the optical axis derived from the liquid crystal compound of the liquid crystal alignment pattern rotates 180°, varies.

In the circularly polarized light-separating layer of the circularly polarized light-separating member, one period in which the optical axis rotates 180° was the same as that in Example 2.

Comparative Example 1

A retardation layer was prepared in the same manner as in Example 1, except that a mask was not used for the exposure of an photo alignment film for forming a patterned retardation layer, and the exposure through a wire grid polarizer was performed only once. Therefore, the obtained retardation layer is an unpatterned retardation layer in which the slow axis direction is uniform in the entire surface.

The retardation layer and a polarizer were positioned such that the slow axis intersected the transmission axis at +45°, and the polarizer was bonded to the retardation layer in the same manner as in Example 1. That is, in this example, the retardation layer is a uniform +λ/4 region without a pattern.

Furthermore, a laminate was prepared without forming a circularly polarized light-separating member on the other surface of the support, and the laminate was combined with the same organic EL substrate as that in Example 1, thereby preparing an optical device. That is, in this example, the laminate is constituted with a support, a retardation layer, and a polarizer laminated in this order.

[Evaluation]

Various optical devices prepared as above were evaluated in terms of light use efficiency (luminous flux) and external light reflection.

<Light Use Efficiency (Luminous Flux)>

All the light emitting portions of the optical device were turned on, and then the luminous flux from the surface of the optical device was measured using a spectral luminometer (manufactured by Labsphere, illumia lite).

The rate of improvement of luminous flux of each of the optical devices relative to the luminous flux of the optical device of Comparative Example 1 was evaluated. Therefore, the rate of improvement of luminous flux of Comparative Example 1 is 0%.

The evaluation standard is as follows. A and B are ranges in which a significant effect is recognized.

A: The rate of improvement of luminous flux is equal to or higher than 15%.

B: The rate of improvement of luminous flux is equal to or higher than 10% and less than 15%.

C: The rate of improvement of luminous flux is equal to or higher than 5% and less than 10%.

D: The rate of improvement of luminous flux is less than 5%.

<External Light Reflection>

All the light emitting portion of the optical device were turned on. In this state, the light emitted from an LED light source was allowed to incident on the optical device in a direction forming an angle of 60° with the normal direction of the optical device, and the brightness values of light reflected in a direction of −58° were measured to determine a reflectance [%]. For measuring the reflectance, SR-3UL1 (manufactured by TOPCON CORPORATION) was used.

The evaluation standard is as follows.

A: The reflectance was equal to or higher than 2% and less than 4%.

B: The reflectance was equal to or higher than 4% and less than 6%.

C: The reflectance was equal to or higher than 6% and less than 8%.

D: The reflectance was equal to or higher than 8%.

The results are shown in the following table.

TABLE 1

| | | | Comparative Example 1 | Example 1 | Example 2 | Example 3 |
|---|---|---|---|---|---|---|
| Constitution | Patterned retardation layer | Pattern of first/second region | No pattern | With pattern | With pattern | With pattern |
| | Circularly polarized light-separating layer | Presence or absence | Absent | Present | Present | Present |
| | | Length of one period corresponding to RGB light | — | — | R > G > B | R > G > B |
| | | Isotropic region | — | Absent | Absent | Present |
| evaluation | | Light use efficiency (luminous flux) | D | B | A | A |
| | | Reflection of external light (reflectance) | A | B | B | A |

In the patterned retardation layer, a first region is a region where the slow axis forms an angle of +45° with the transmission axis of the polarizer.
In the patterned retardation layer, a second region is a region where the slow axis forms an angle of −45° with the transmission axis of the polarizer.
RGB light is the light emitted from the light emitting portions of the organic EL substrate, and the length of one period is the length of one period in each region corresponding to the light of each color.

As shown in the above table, the optical device according to the embodiment of the present invention, which has a circularly polarized light-separating layer separating light into right-handed circularly polarized light and left-handed circularly polarized light and a patterned retardation layer patterned to form regions having different slow axis directions and converting right-handed circularly polarized light and left-handed circularly polarized light into linearly polarized light in the same direction, can improve the light use efficiency and can suitably prevent the reflection of external light.

Particularly, the light use efficiency is improved in Example 2 and Example 3 wherein one period, in which the optical axis in the liquid crystal alignment pattern rotates 180°, in the circularly polarized light-separating layer increases as the wavelength of light incident on a region increases according to red light (R), green light (G), and blue light (B). Especially, extremely high light use efficiency is obtained in Example 3 wherein a region, on which the light from the light emitting portions of the organic EL substrate is not incident, in the circularly polarized light-separating layer is adopted as an isotropic region.

In contrast, in Comparative Example 1 which is a conventional optical device without a circularly polarized light-separating layer and a patterned retardation layer, although the performance of preventing external light reflection is high, the light use efficiency is low.

The above results clearly show the effects of the present invention.

The present invention can be suitably used in various optical devices using organic EL such as an organic EL display device and an organic EL lighting device.

EXPLANATION OF REFERENCES 10 optical device
12 organic EL substrate
12R R light emitting portion
12G G light emitting portion
12B B light emitting portion
12N non-light emitting portion
14R R circularly polarized light-separating member
14G G circularly polarized light-separating member
14B B circularly polarized light-separating member
16 patterned retardation layer
16a first region
16b second region
18 polarizer
20, 46 support
24, 48 alignment film
26, 42a circularly polarized light-separating layer
30 liquid crystal compound
30A optical axis
40, 42 circularly polarized light-separating member
40R, 42R R circularly polarized light-separating region
40G, 42G G circularly polarized light-separating region
40B, 42B B circularly polarized light-separating region
42N isotropic region
60 exposure device
62 laser
64 light source
68 beam splitter
70A, 70B mirror
72A, 72B λ/4 plate
$L_1$, $L_4$ incidence ray
$L_2$, $L_5$ circular polarization of transmitted light
M laser beam
MA, MB light rays
$P_O$ linearly polarized light
$P_R$ right-handed circularly polarized light
$P_L$ left-handed circularly polarized light
Q1, Q2 absolute phase
E1, E2 equiphase plane
Z, A, R, G, B region

What is claimed is:

1. An optical device comprising, in the following order:
an organic electroluminescent substrate having light emitting portions by organic electroluminescence and a non-light emitting portion which has a metallic reflecting portion;
a circularly polarized light-separating layer that is formed of a composition including a liquid crystal compound, has a liquid crystal alignment pattern in which a direction of an optical axis derived from the liquid crystal compound changes while continuously rotating in at least one direction in a plane, and separates light emitted from the light emitting portions of the organic electroluminescent substrate into right-handed circularly polarized light and left-handed circularly polarized light;

a patterned retardation layer that converts the circularly polarized light separated by the circularly polarized light-separating layer into linearly polarized light, has constant in-plane retardation, and includes a plurality of regions among which a direction of a slow axis varies in the same plane, and a polarizer.

2. The optical device according to claim 1, wherein the organic electroluminescent substrate has the light emitting portions emitting light having different wavelengths.

3. The optical device according to claim 2, wherein in a case where a length, over which the direction of the optical axis derived from the liquid crystal compound rotates 180° in one direction along which the direction of the optical axis derived from the liquid crystal compound changes while continuously rotating in the liquid crystal alignment pattern of the circularly polarized light-separating layer, is regarded as one period, the optical device has a plurality of kinds of circularly polarized light-separating layers among which the length of the one period varies.

4. The optical device according to claim 3, wherein in the circularly polarized light-separating layer, depending on a wavelength of an incidence ray, the longer the wavelength of the incidence ray that is incident on a region, the longer the one period in the region.

5. The optical device according to claim 1, wherein the circularly polarized light-separating layer has an isotropic region in which no liquid crystals are aligned.

6. The optical device according to claim 5, wherein the isotropic region is provided in a region on which the light from the light emitting portions of the organic electroluminescent substrate is not incident.

7. The optical device according to claim 1, wherein the patterned retardation layer has a region having a slow axis forming an angle of +45° with a transmission axis of the polarizer and a region having a slow axis forming an angle of −45° with the transmission axis of the polarizer.

8. The optical device according to claim 1, further comprising:

a support, wherein one surface of the support is provided with the circularly polarized light-separating layer and the other surface of the support is provided with the patterned retardation layer and the polarizer.

* * * * *